United States Patent [19]
Rogers

[11] Patent Number: 5,689,192
[45] Date of Patent: Nov. 18, 1997

[54] METHOD FOR SIMULATING A CONTROLLED VOLTAGE FOR TESTING CIRCUITS FOR ELECTROMAGNETIC SUSCEPTIBILITY

[75] Inventor: Wesley A. Rogers, Grosse Pointe Park, Mich.

[73] Assignee: Electronic Development, Inc., Grosse Pointe Park, Mich.

[21] Appl. No.: 659,221

[22] Filed: Jun. 7, 1996

Related U.S. Application Data

[62] Division of Ser. No. 388,194, Feb. 13, 1995, Pat. No. 5,552,715, which is a division of Ser. No. 44,219, Apr. 7, 1993, Pat. No. 5,414,345, which is a continuation-in-part of Ser. No. 692,719, Apr. 29, 1991, abandoned.

[51] Int. Cl.$^6$ ..................................................... G01R 27/28
[52] U.S. Cl. ........................ 324/627; 324/602; 324/603; 342/170
[58] Field of Search ................................. 324/501, 503, 324/527, 601, 602, 603, 627, 637, 72

[56] References Cited

U.S. PATENT DOCUMENTS

| | | | |
|---|---|---|---|
| 3,737,708 | 6/1973 | Ari et al. | 324/158 F |
| 3,743,925 | 7/1973 | Bossi | 324/629 |
| 3,991,397 | 11/1976 | King | 338/214 |
| 4,255,750 | 3/1981 | Riley | 324/627 |
| 4,328,461 | 5/1982 | Butters et al. | 324/72 |
| 4,365,192 | 12/1982 | Rankin et al. | 324/72 |
| 4,425,542 | 1/1984 | Tsaliovich et al. | 324/627 |
| 4,471,348 | 9/1984 | London et al. | 324/121 R |
| 4,510,468 | 4/1985 | Mayer | 338/214 X |
| 4,521,780 | 6/1985 | Preikschat | 342/170 |
| 4,647,844 | 3/1987 | Biegon et al. | 324/627 |
| 4,704,596 | 11/1987 | Coffey et al. | 338/214 |
| 4,839,586 | 6/1989 | Musseau et al. | 324/501 |
| 4,845,378 | 7/1989 | Garbe et al. | 307/106 |
| 4,939,446 | 7/1990 | Rogers | 324/72 |

(List continued on next page.)

FOREIGN PATENT DOCUMENTS

| | | | |
|---|---|---|---|
| 0287771 | 2/1988 | European Pat. Off. | G01R 1/100 |
| 2215067 | 9/1989 | United Kingdom | G01R 31/00 |
| 2256057 | 11/1992 | United Kingdom | G01R 31/100 |

OTHER PUBLICATIONS

Knowles et al., "Cable Shielding Effectiveness Testing," IEE Trans. on Electromagnetic Compatibility, 1974, vol. EMC-16, No. 1, pp. 16-23. (month unavailable).

(List continued on next page.)

*Primary Examiner*—Glenn W. Brown
*Attorney, Agent, or Firm*—Orrick, Herrington & Sutcliffe LLP

[57] ABSTRACT

Apparatus and method for low cost monitoring the level of signal at a test point in a system for susceptibility to electromagnetic fields. A probe, including a detector diode, and a non-metallic, electrically overdamped conductor, which is transparent to the electromagnetic field, is used to monitor the signal level at a test point as an amplitude modulated radio frequency carrier. The carrier is transmitted to a monitor outside of the range of the electromagnetic field using a transmission link, such as an optical waveguide transmitter, that is transparent to the electromagnetic field when the system under test fails. The system under test can then be removed from the electromagnetic field and, for each frequency at which the system failed, a voltage can be injected, using a voltage injection probe, into the system at another point to recreate the detected level of signal at the test point that was coupled into the system from the electromagnetic field. This simulates the effect of the susceptibility to the electromagnetic field, and permits testing of a suitable filter or other expedient applied to the system, even though the system is not exposed to the electromagnetic field. Thus, the system may be tested for susceptibility inside a shielded enclosure and subjected to a controlled electromagnetic field, and the susceptibility may be recreated and solved outside of the shielded enclosure. The probe may include a plurality of detector diodes mounted on a printed circuit board in a shielded structure that is directly connected to the test wire of the circuit to be monitored.

12 Claims, 15 Drawing Sheets

U.S. PATENT DOCUMENTS

| | | | |
|---|---|---|---|
| 4,962,358 | 10/1990 | Svetanoff | 324/627 |
| 4,973,911 | 11/1990 | Marshall | 324/628 |
| 4,977,376 | 12/1990 | Shiek et al. | 324/72 |
| 4,989,260 | 1/1991 | Meade | 455/95 |
| 5,006,788 | 4/1991 | Goulette | 324/95 |
| 5,068,616 | 11/1991 | Broyde et al. | 324/627 |
| 5,237,283 | 8/1993 | Carbonini | 324/627 |
| 5,311,116 | 5/1994 | Rogers | 324/72.5 |
| 5,406,209 | 4/1995 | Johnson et al. | 324/750 |
| 5,414,345 | 5/1995 | Rogers | 324/72.5 |
| 5,414,366 | 5/1995 | Rogers | 324/627 |
| 5,514,971 | 5/1996 | Hankui et al. | 324/639 |

OTHER PUBLICATIONS

Preliminary Product Bulletin for Flurosint® 719 Insulated Monofilament and Flurosint® 819 Dual Line, by the Polymer Corporation. (undated).

Gary F.E. Vrooman, "Vehicle Level EMC Testing Methodology," Ford Motor Company, Jan. 1988.

Bulletin for AITECH Current Probes, Eaton Advanced Electronic, Nov. 1981.

Product Literature, Broadband Isotropic Probe Systems, EMCO, Jan. 1990.

Product Literature, Model 5188 and Model 3718 Micrograbber Test clips, ITT Pomona Electronics, Jan. 1989.

Frank M. Greene, "A New Near-Zone Electric-Field-Strength Meter," Journal of Research, vol. 71C, No. 1, Jan.-Mar. 1967.

G.A. Jackson, "Survey of EMC Measurement Techniques", *Electronics and Communications Engineering Journal, 1., Mar./Apr. 1989, No. 2, pp. 61–70.*

Ir. G.A. van der Pijl, "Methoden voor hoogfrequent-tests", 825 PT Elektronica–Elektrotechniek, 45 (1990) Apr., No. 4, Rijswijk, NL.

H. Birkner, et al., "Elektrotechnik und Informationstechnik", 8038 E&I Elektrotechnik and Informationstechnik 108 (1991) No. 9, Wien, AT, pp. 285–399. (month available).

RADIATED SIGNAL

COUPLED SIGNAL

DETECTED SIGNAL

AVERAGE (OR PEAK) LEVEL

INJECTED SIGNAL (ADJUSTED UNTIL D' = D)

DETECTED SIGNAL

AVERAGE (OR PEAK) LEVEL

RADIATED CW SIGNAL

DETECTED SIGNAL

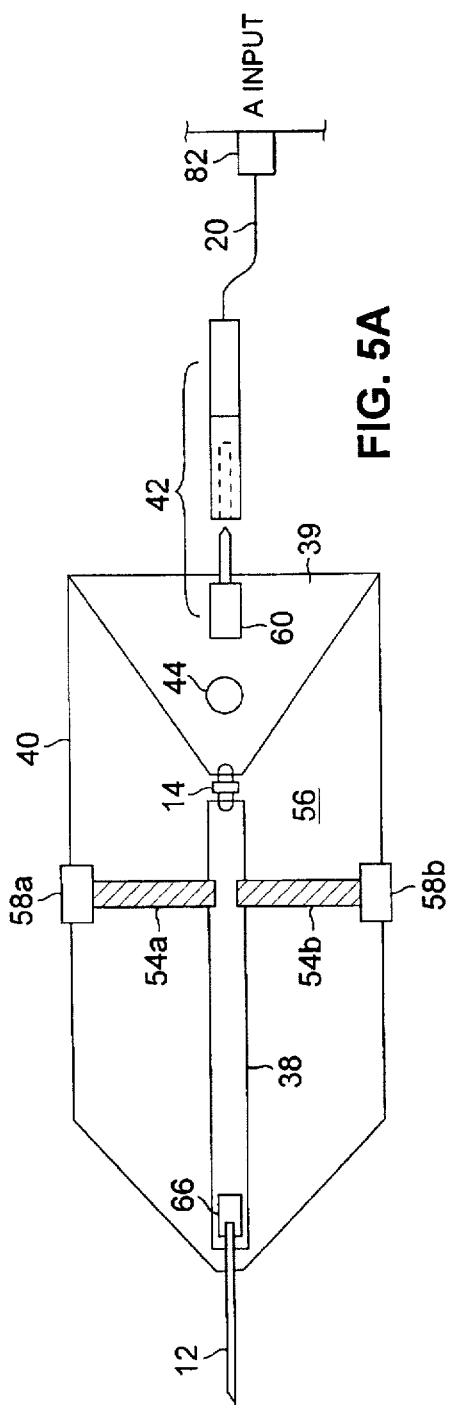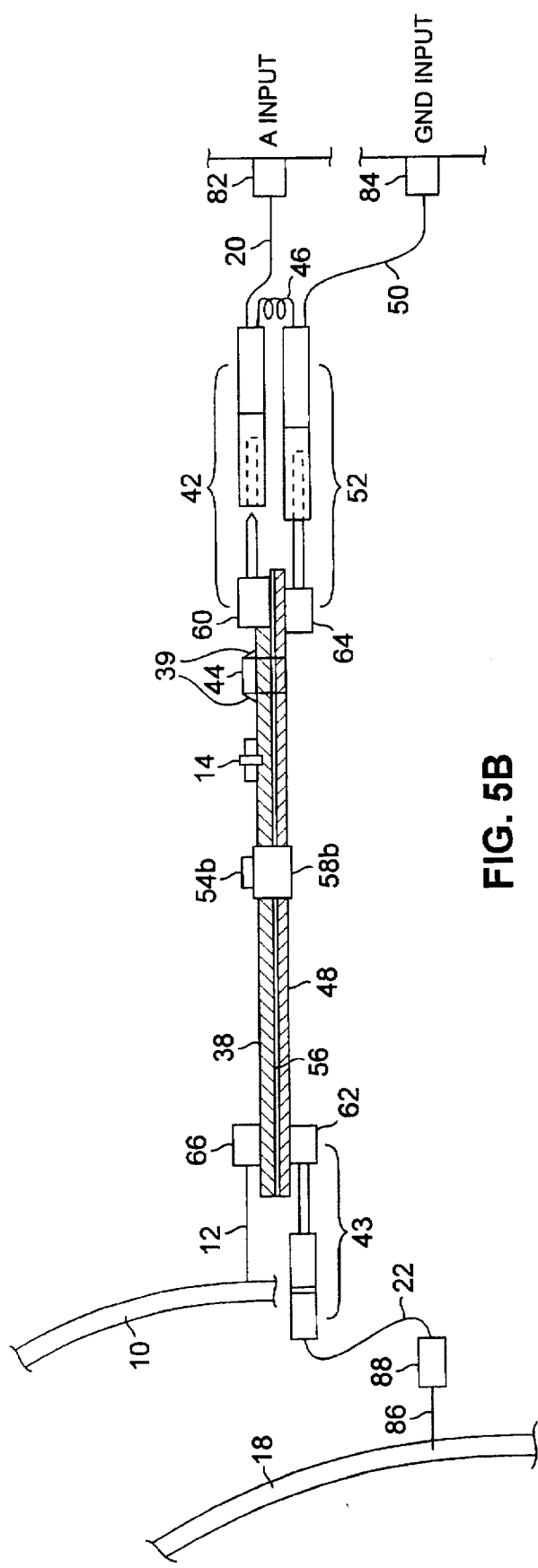

METHOD FOR SIMULATING A CONTROLLED VOLTAGE FOR TESTING CIRCUITS FOR ELECTROMAGNETIC SUSCEPTIBILITY

This is a divisional of U.S. patent application Ser. No. 08/388,194, filed on Feb. 13, 1995 and entitled Apparatus for Low Cost Electromagnetic Field Susceptibility Testing, now U.S. Pat. No. 5,552,715, which is a divisional of U.S. patent application Ser. No. 08/044,219 filed Apr. 7, 1993 and entitled Apparatus and Method for Low-cost Electromagnetic Field Susceptibility Testing, now U.S. Pat. No. 5,414, 345, which is a continuation-in-part of U.S. patent application Ser. No. 07/692,719, filed Apr. 29, 1991 and entitled Electromagnetic Field Susceptibility Test Apparatus and Methods, now abandoned.

FIELD OF THE INVENTION

The present invention relates to the field of testing the susceptibility of devices and systems to radiated electromagnetic fields, and E fields in particular.

BACKGROUND OF THE INVENTION

Analog and digital electronic circuitry and attendant wiring may encounter serious operating difficulty in the presence of radiated electromagnetic fields. When such fields interfere with the operation of electronic circuitry, they are generally referred to as Electromagnetic Interference (EMI) fields. The circuits and attendant wiring may be shielded and filtered to provide some immunity to large electromagnetic fields, however, it is not possible or practical to design the circuitry and attendant wiring so as to ensure immunity to such fields. Indeed, shielded cables can sometimes be more susceptible to EMI problems than unshielded wires, because bending of a shielding cable, or other abuse, may produce a pin hole in the shielding, which can cause the shielding to act as a waveguide for EMI, with consequent deleterious effects.

Methods and apparatus, therefore, are required to test the susceptibility of the devices, such as integrated circuits, electrical components, and the like, and systems, such as automotive electrical systems, for both commercial and military applications, to electromagnetic fields. The term "system" is employed hereinafter to broadly describe any device or system, such as, but not limited to those described above, that may be tested for susceptibility to radiated electromagnetic fields.

Electromagnetic field testing is typically performed in shielded enclosures, or "screen rooms," which provide an environment wherein ambient electromagnetic fields are eliminated and a controlled field is produced, in order to determine, with certainty, the effect of a given level (measured in volts per meter) and frequency of electromagnetic fields on the system undergoing test. Apparatus typically used inside the shielded enclosure includes current probes attached to a system harness wire and a transmitter which sends the signals detected by the probes to a receiver outside the shielded enclosure, where the effects of the electromagnetic fields on the system are determined.

To ensure the integrity of the shielded enclosure and the results of the tests, any voltage measuring apparatus within the screen room should minimally perturb the controlled electromagnetic fields and should not inject EMI into the system. For example, any test apparatus which might reradiate electromagnetic fields impinging on the device under test, or might itself be susceptible to such fields or otherwise inject any noise into the system, must be avoided.

In U.S. Pat. No. 4,939,446, by Wesley A. Rogers, the inventor of the present invention, the performance of a system under test is observed in a shielded enclosure, with and without the presence of controlled E fields radiated by one or more antennas. The problem of reradiation of fields, or the injection of noise into the system by the test equipment itself, is eliminated through the use of non-metallic overdamped conductors, and a hybrid electrical/optical transmitter and optical cable used to transmit voltage signals from the system to a receiver monitored by an oscilloscope located outside the shielded enclosure. The approach set forth in the above patent allows accurate testing of systems in a controlled electromagnetic environment, since the overdamped conductors are transparent to the electromagnetic fields. The entire disclosure of U.S. Pat. No. 4,939,446 is incorporated herein by reference thereto.

The standard operating procedure in determining the susceptibility of systems to radiated electromagnetic fields is to place the system in a shielded enclosure, as mentioned above, and to test the susceptibility of the system over a wide range of radio frequencies, for example from 10 KHz to 18 GHz or more. The radiated field is swept through the desired frequency range, at a range of levels, e.g. between 1 v/m and 300 v/m, and the susceptibility of the system is determined over the range of frequencies. If, for example, it is determined that the system is susceptible to a radiated field at 2 GHz and a certain volt per meter level, a suitable filter or other expedient can be placed in the system, and the system retested at that frequency and level to see whether the filter is effective in removing the system's susceptibility. If the system is still susceptible, the filter must be changed, or another approach must be adopted.

This trial and error technique must be used for each frequency and level at which there is a susceptibility problem. Moreover, the trial and error testing and retesting has to take place in a shielded enclosure, as referred to above, since the FCC prohibits the generation of the antenna-radiated fields necessary to conduct open air testing, and since there is no way to tell what effect, if any, ambient fields might have on the system—the controlled environment provided by the shielded enclosure is necessary to accurately determine susceptibility problems. The testing and retesting of systems, in order to troubleshoot and alleviate susceptibility to radiated fields, usually requires between one and two weeks for each system. The rental of a shielded enclosure, such as a screen room, can cost between $1,000–$3,000 a day, and thus runs into considerable expense, and constitutes a bottleneck for the development of new systems. Furthermore, even with this procedure, there is no indication of the voltage level of EMI induced in the system that caused a failure. A test technique that allows an accurate determination of that level has long been desired.

The RF Probe described in the prior U.S. patent application Ser. No. 08/153,502, now U.S. Pat. No. 5,414,366, is particularly useful for frequencies in the range of 10 KHz to 18 GHz or more, which are particularly appropriate for military applications. However, it is now realized that susceptibility testing at the higher frequencies, namely from 1.4–18.0 GHz, are not necessary for use in most commercial applications. Accordingly, it is desirable to obtain a lower cost RF probe that operates in the range of from 10 KHz to on the order of 1.40 GHz.

OBJECTS AND SUMMARY OF THE INVENTION

It is therefore an object of the present invention to overcome the difficulties associated with the prior art.

It is a further object of the present invention to allow rapid and less expensive testing of systems for susceptibility to radiated electromagnetic fields.

It is a further object of the present invention to provide a probe that allows the level of a radiated field coupled into a system to be measured, without injecting the radiated field energy into the system, or otherwise affecting the level of EMI coupled into a system.

It is a further object of the present invention to provide an apparatus and method for accurately correcting for susceptibility to radiated fields outside of a shielded enclosure—after initial testing in a shielded enclosure.

It is a further object of the present invention to provide an apparatus and method for determining the level of EMI coupled into a system for particular levels and frequencies of radiated fields.

It is a further object of the present invention to provide apparatus for radio frequency (RF) voltage injection into a wire of a system under test.

It is a further object of the present invention to provide an apparatus and method that allow the injection of RF voltages into a system at a level and frequency so as to accurately simulate the susceptibility of the system to particular levels and frequencies of radiated fields.

It is a further object of the present invention to provide apparatus and methods for testing a device under test for susceptibility to radiated electromagnetic fields at a plurality of wires using a corresponding plurality of probes. It is another object to multiplex the output of the probes to the outside of the shielded enclosure for monitoring selectively, one or more of the test wires to which each probe is attached, external of the shielded enclosure.

In accordance with the present invention, a probe is first used to monitor the level of a radiated electromagnetic field, in the form of an amplitude modulated (AM) RF carrier, coupled into a system in a shielded enclosure. The probe includes a detector diode which is placed at a selected part of the system. The output of the detector diode, is applied to a monitor outside the shielded enclosure through the use of a non-metallic, overdamped wire, and a suitable transmission link. The probe and non-metallic wire are neither susceptible to the radiated field, nor do they inject EMI into the system under test.

The amplitude modulation detected by the detector diode is easily within the pass band of the non-metallic, overdamped wire so that the detected signal can pass to the monitor, through the overdamped wire and through the transmission link, which can be in the form of an optical transmitter.

In accordance with the present invention, the probe also may be used to monitor the level of a radiated electromagnetic field in the form of a continuous wave RF carrier coupled into a system in the shielded enclosure. The probe includes a detector diode which is placed at a selected part of the system. The output of the detector diode, which is a DC signal, is applied to a monitor outside the shielded enclosure through the use of a non-metallic, overdamped wire, and a suitable transmission link. The probe and non-metallic wire are neither susceptible to the radiated field, nor do they inject EMI into the system under test.

The radiated signal detected by the detector diode is easily within the passband of the non-metallic, overdamped wire. The detector diode may further comprise a plurality of detector diodes, e.g., when the peak to peak voltage level of the radiated signal is greater than the reverse bias voltage of each detector diode. In such case, additional detector diodes are used in series to distribute the voltage at the probe input across the detector diodes. The detector diode or diodes are preferably mounted on a conventional printed circuit board having a ground plane which is connected to a copper shield. Both the copper ground plane and copper shield are allowed to float. This detector diode is suitable for detecting susceptibility at frequencies up to about 1.4 GHz. The detector diode also may be operated with the shield connected to ground, unless undesirable resonances occur in the grounded condition. In such case, the shield should be allowed to float.

The voltage level and frequency of EMI coupled into the system, as detected by the detector diode, is noted whenever the system under test fails. The system can then be removed from the shielded enclosure and for each frequency and level at which the system was susceptible to the field, an amplitude modulated RF voltage or a continuous wave RF voltage can be injected into the system at a level sufficient to recreate the level of EMI coupled into the system in the shielded enclosure, thereby essentially replicating the effect of the controlled field level in the shielded enclosure. A suitable filter or other expedient can then be applied to the system, the same voltage level can be injected into the system, and the system can be observed to see whether it no longer fails under such conditions.

In accordance with another aspect of the present invention, the probe comprises a microwave circuit designed to maintain the input impedance of the diode constant throughout the frequency range of interest.

In accordance with another aspect of the present invention, a capacitive voltage injection probe is provided for allowing the injection of voltage into the system under test when in accordance with the testing procedure described above.

In accordance with another aspect of the present invention, a plurality of probes are connected to a plurality of wires in the device under test and the output of the probes are connected to a multiplexor device inside the shielded enclosure. The multiplexor device provides an output that can be passed out of the shielded enclosure to a corresponding demultiplexor. The demultiplexor then recreates the probe output signals for display or printing, e.g., on a strip chart. The multiplexor-demultiplexor system may use a control circuit for controlling the multiplexor to sequence through-the plurality of inputs. Preferably, a time multiplexing arrangement is used whereby each of the probes is sampled periodically and the signals at each of the test wires can be displayed external of the shielded enclosure. A frequency multiplexed arrangement also may be used whereby the output of each probe is converted into a unique frequency signal such that unique frequencies are collectively transmitted to a demultiplexor external to the shielded enclosure over a common conductor, e.g., optical fiber, and then separated for separate display. The latter technique provides for a continuous display of each test wire being monitored and is simpler with respect to avoiding the requirement for synchronizing the clock in the time based multiplexor.

BRIEF DESCRIPTION OF THE DRAWINGS

These and other objects, aspects and embodiments of the invention will be described in more detail with reference to the following drawing figures of which:

FIGS. 5A and 5B illustrate an example of the microwave circuit board implementation of the circuitry illustrated in FIG. 4;

DETAILED DESCRIPTION OF THE INVENTION

Figure 1:
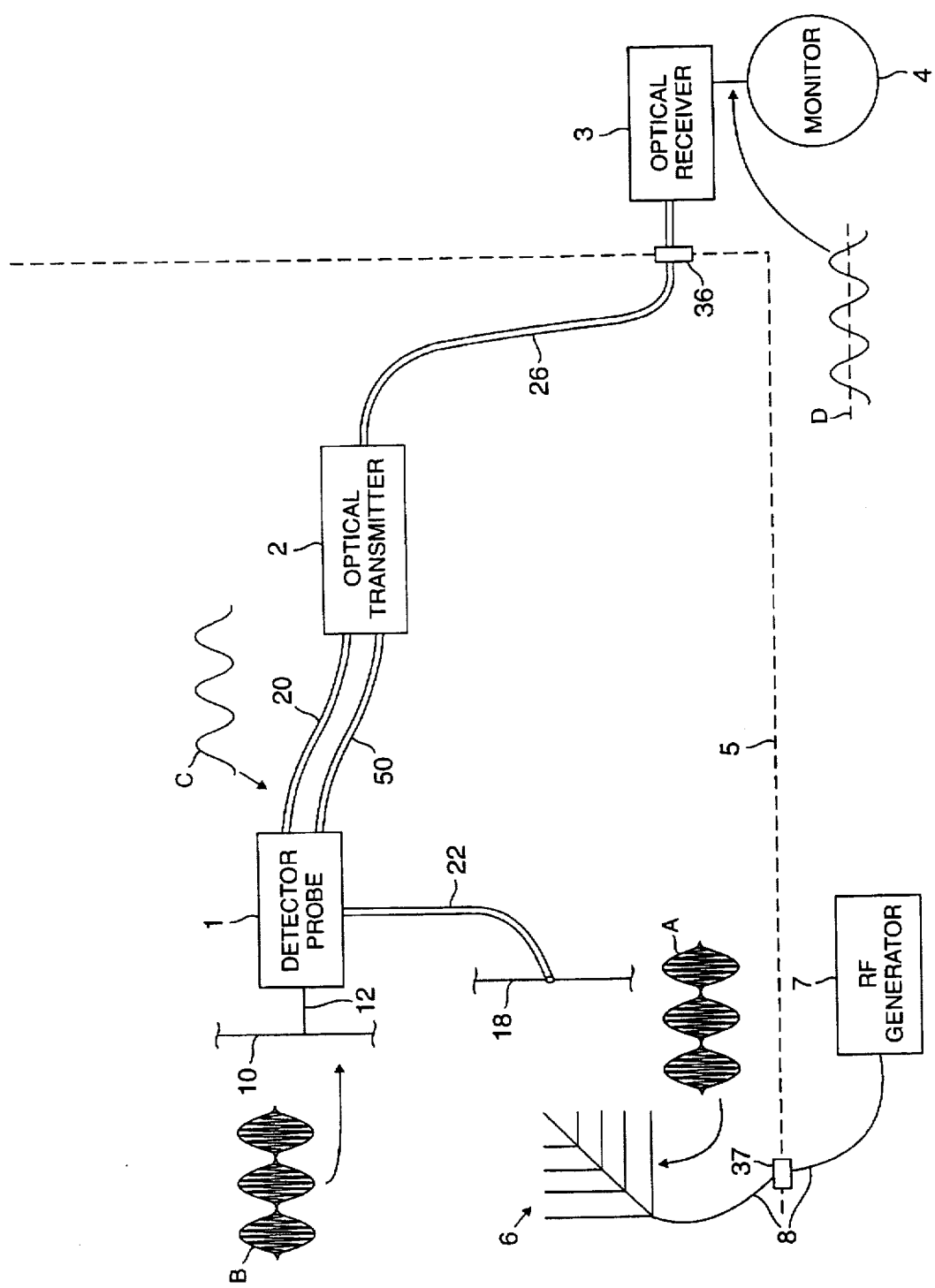
FIG. 1 is a diagram illustrating the use of the probe, non-metallic conductors and transmission link, in accordance with one aspect of the present invention, in a shielded enclosure, to determine the level of a field coupled onto wires of systems under test.

With reference to FIG. 1, a probe 1, in accordance with one aspect of the present invention, is illustrated along with an optical transmission link, as used in accordance with the method of determining and correcting for EMI susceptibility of a system under test, in accordance with another aspect of the present invention. Specifically, the probe 1 is connected to a lead 10 of the system under test, such as an automotive electrical system, byway of a clip or pin 12 which can either comprise a short conductive clip or pin, having a length less than or equal to one centimeter, to prevent the field from coupling onto the clip or pin. Alternatively, a longer clip or pin can be employed, having its insulation coated with a conductive or reflective paint or foil, open at both ends, to effectively shield it from EMI.

The detector probe 1 is also connected to a ground wire 18 from the system under test by way of non-metallic conductor 22, and to optical transmitter 2, by way of nonmetallic conductors 20 and 50. The non-metallic conductors 20, 22 and 50 can be formed of one or more continuous monofilament cores of plastic which are impregnated with fine conductive particles, such as carbon, and covered with the plastic insulating sheet. A conductor material with the above described characteristics is marketed by the Polymer Corporation of Reading, Pa. under the trade name FLUOROSINT® 719. It comprises a carbon/fluropolymer core 0.030 inches in diameter enclosed by a transparent nylon insulating cover with an outer diameter of 0.040 inches and has resistance per length of cable within the range of 20,000 to 30,000 ohms per foot. Such non-metallic cores have a uniformly distributed resistance, capacitance and inductance, causing them to be electrically overdamped and transparent to electromagnetic fields. It must be noted, however, that the bandwidth of such cores is usually no more than approximately 20 MHz, much less than many of the frequency ranges of interest. Preferably, the conductors 20, 22 and 50 can be-formed of four or five such monofilament cores to reduce the linear resistance to about 6K ohms/foot, the conductors 20, 22 and 50 preferably providing a total resistance on the order of 10,000 to 20,000 ohms. Optionally, with reference to FIGS. 1 and 3, optical transmitter 2 can be directly connected to ground 18 of the device under test by a non-metallic conductor such that conductors 50 and 22 may be eliminated (not shown).

It will be appreciated, in view of the above mentioned U.S. Pat. No. 4,939,446, that by maintaining proper lengths of the metallic conductors such as pin 12, by covering the insulation of such elements with conductive paint or foil, and by using the non-metallic conductors 20, 22 and 50, the probe in accordance with the present invention is transparent to electromagnetic fields, will not re-radiate such fields, and will not inject EMI into the system under test.

The other ends of non-metallic conductors 20 and 50 are applied to an optical transmitter 2, which includes a high input impedance amplifier having a gain on the order of approximately 1,000, although the gain of the amplifier can be selected as desired, and an LED, driven by the amplifier, which delivers a light signal to optical cable 26. The exact form of the amplifier and associated circuitry is not critical and can be comprised of a standard low drift DC or analog amplifier, but state of the art techniques should be used to insure minimum operational amplifier offset voltages. The opposite end of the optical cable 26 is applied to an optical receiver 3, which can include a photo diode or other suitable light detector, and an amplifier which receives the output of the photo diode, and which delivers an output that can be viewed on a voltage monitor 4 or a plurality of monitors, if desired. The monitor 4 can be any voltage sensitive device capable of detecting signals down to the microvolt level, such as an oscilloscope or spectrum analyzer.

The detector probe 1 and optical transmission link can be used to determine the level of a radiated field coupled into the system under test that causes the system to fail. As shown in FIG. 1, the system under test, the probe 1, the transmitter 2 and a portion of the optical cable 26, are disposed within a shielded enclosure 5 which provides a controlled electromagnetic field environment, through the activation of one or more antennas 6 which radiate an "E" field. The antenna 6 is driven by RF generator 7 in a well-known manner and is connected thereto by way of shielded cable 8. As mentioned above, shielded enclosures, such as screen rooms, are routinely used in testing systems for electromagnetic field susceptibility since FCC regulations prohibit the use of such radiated fields in the open air, and because systems being tested outside the controlled environment of the enclosure might be affected by ambient fields, and a precise cause-and-effect relationship could not be determined. By testing within the shielded enclosure, ambient fields are eliminated and the field level applied to the system is carefully controlled.

The optical cable 26 and shielded cable 8 pass through the enclosure 5 by way of waveguide-beyond-cutoff filter 36 and coaxial feedthrough connector 37, respectively. The optical transmitter 2 should be disposed within an RF shielded enclosure, but alternatively, the non-metallic conductors 20 and 50 may extend out through the filter 36, in which case the optical portion of the transmission link can be omitted, the outputs of conductors 20 and 50 being passed directly to an amplifier outside the enclosure 5.

In order to determine the level of EMI coupled into the system under test that causes the system to fail, RF generator 7 is activated to cause antenna 6 to radiate an E field in the form of an amplitude modulated carrier at a particular frequency, for example, a 1 GHz carrier, 100% amplitude modulated by a 1 KHz signal, but the frequencies, modulation levels, etc., as well as the radiated field level, can be chosen as desired, in a manner well known in the art. The signal radiated from antenna 6 is illustrated in FIGS. 1 and 2 as signal A.

A certain level of the radiated field will be coupled into the system to produce a coupled signal voltage B, as shown in FIGS. 1 and 2. The level of the coupled signal B is detected by the detector probe 1 and the envelope, corresponding to the detected signal C, as shown in FIGS. 1 and 2, is produced at the output of the detector probe. In the above described example, signal C is at the modulation frequency of 1 KHz, which is easily transmitted along the restricted bandwidth of the non-metallic conductors 20 and 50. The signal C is applied to optical transmitter 2, and it, or a signal related to its average, RMS, or peak voltage, such as voltage level D, FIG. 2, is transmitted to the optical receiver 3, and monitored by monitor 4. Conversion of signal C to a related voltage level, such as the D.C. average voltage, voltage level D, can be performed before or after transmission, and if done after transmission, a 1 KHz notch filter, in this example, can be used in the transmission path in order to eliminate any DC offsets and/or noise on the non-metallic wire or system under test. Alternatively, the signal C can be transmitted and monitored directly at monitor 4.

Figure 1A:
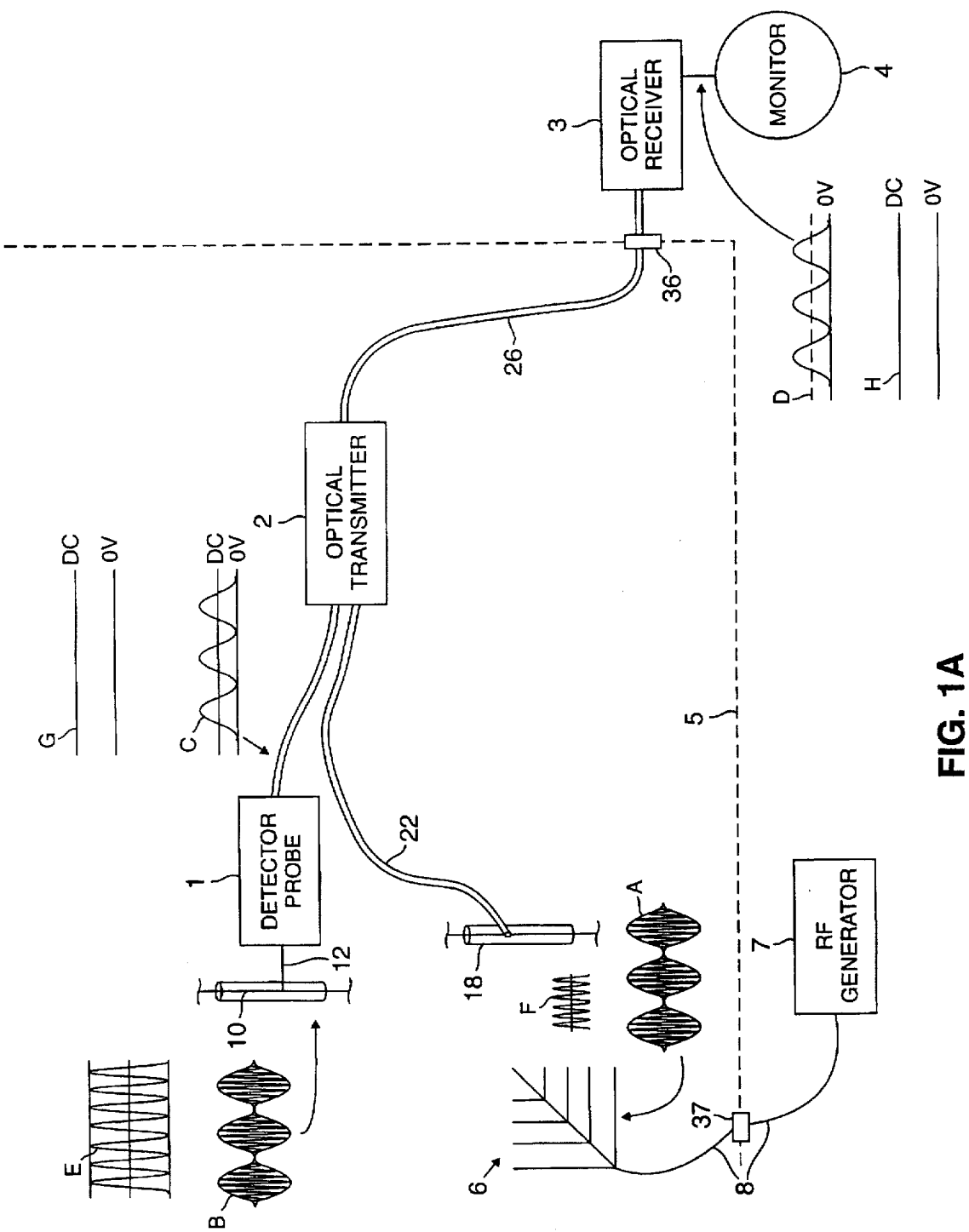
FIG. 1A is a diagram illustrating the use of a low cost RF probe non-metallic conductors and transmission link, in accordance with one aspect of the present invention, in a shielded enclosure, to determine the level of a field coupled onto wires of systems under test.
Figure 2A:
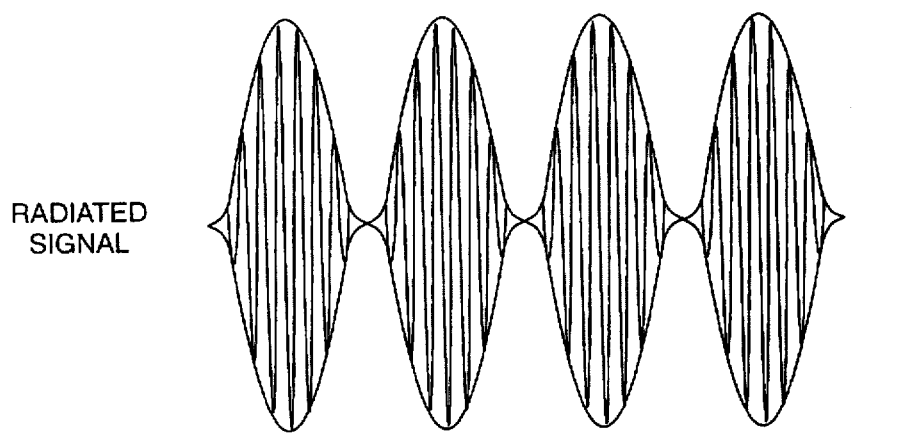
FIGS. 2A, 2B, 2C, 2D, 2E, 2C$^1$, 2D$^1$, 2F and 2G depict signals radiated, coupled, detected and injected, in accordance with the method of determining and correcting the susceptibility of systems to EMI, in accordance with another aspect of the present invention.
Figure 2B:
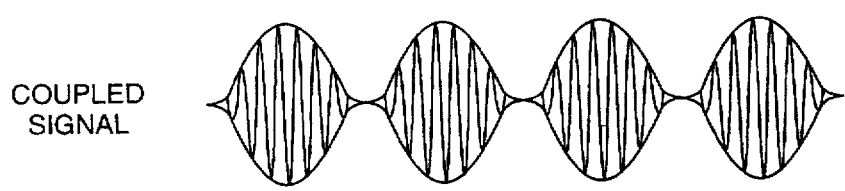
Figure 2C:
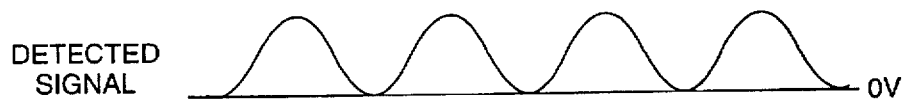
Figure 2D:
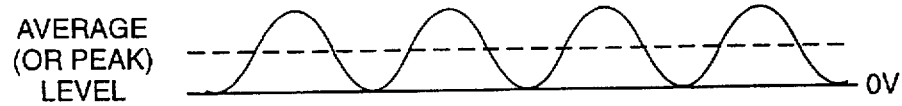
Figure 2E:
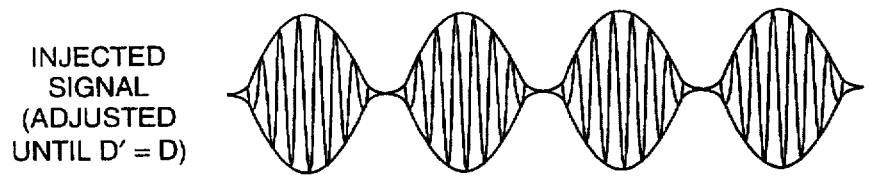
Figure 2C:
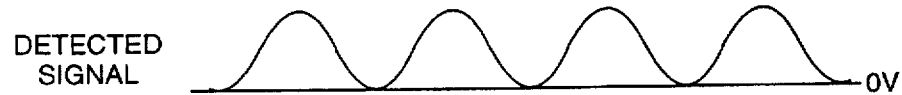
Figure 2D:
Figure 2F:
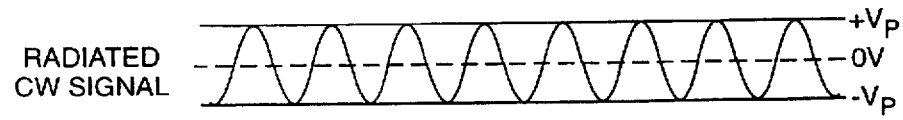
Figure 2G:
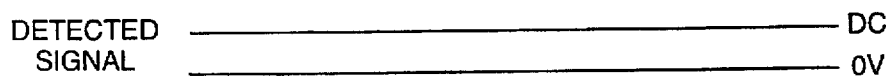

In an alternate embodiment, the level of EMI coupled into the system under test that causes the system to fail can be determined in response to a radiated E field in the form of a continuous wave carrier at a particular frequency, for example, a 10 GHz carrier, having a peak-to-peak voltage as illustrated in signal E of FIG. 1A and FIG. 2F. A certain level of the radiated field will be coupled into the system to produce a coupled signal G having a DC level bias, as shown in FIGS. 1 and 2G. The level of the coupled signal is detected by the detector probe 1, corresponding to the DC level indicated in signal C, as shown in FIGS. 1 and 2, and is produced at the output of detector probe 1. In this example, signal C is a DC level which is easily transmitted along the restricted bandwidth of the non-metallic conductors 20 and 50. The DC signal G is applied to optical transmitter 2 and it, or a signal related to its value, such as the signal H, is transmitted to the optical receiver 3 and monitored by monitor 4.

As is well known in EMI testing, a power supply is typically employed to supply electrical power to the system under test, through a Line Impedance Stabilization Network (LISN). LISN's are used in most EMI test set-ups to stabilize the test against variations in the impedance of the power supply.

As the testing proceeds, the carrier frequency, whether or not modulated, and volt/meter level of the radiated E field, produced by antenna 6, is swept in frequency (usually from 10 KHz to 18 GHz), and in level until the system under test fails, at which point, the voltage D (or H) detected at the monitor 4 (FIGS. 1 and 2) and the carrier frequency are noted, and the frequency and signal level are swept again and the process repeated. The result of such testing will be a table of radiated field levels and frequencies, at which the system failed, along with the corresponding voltage levels D detected by the detector probe 1.

Figure 3:
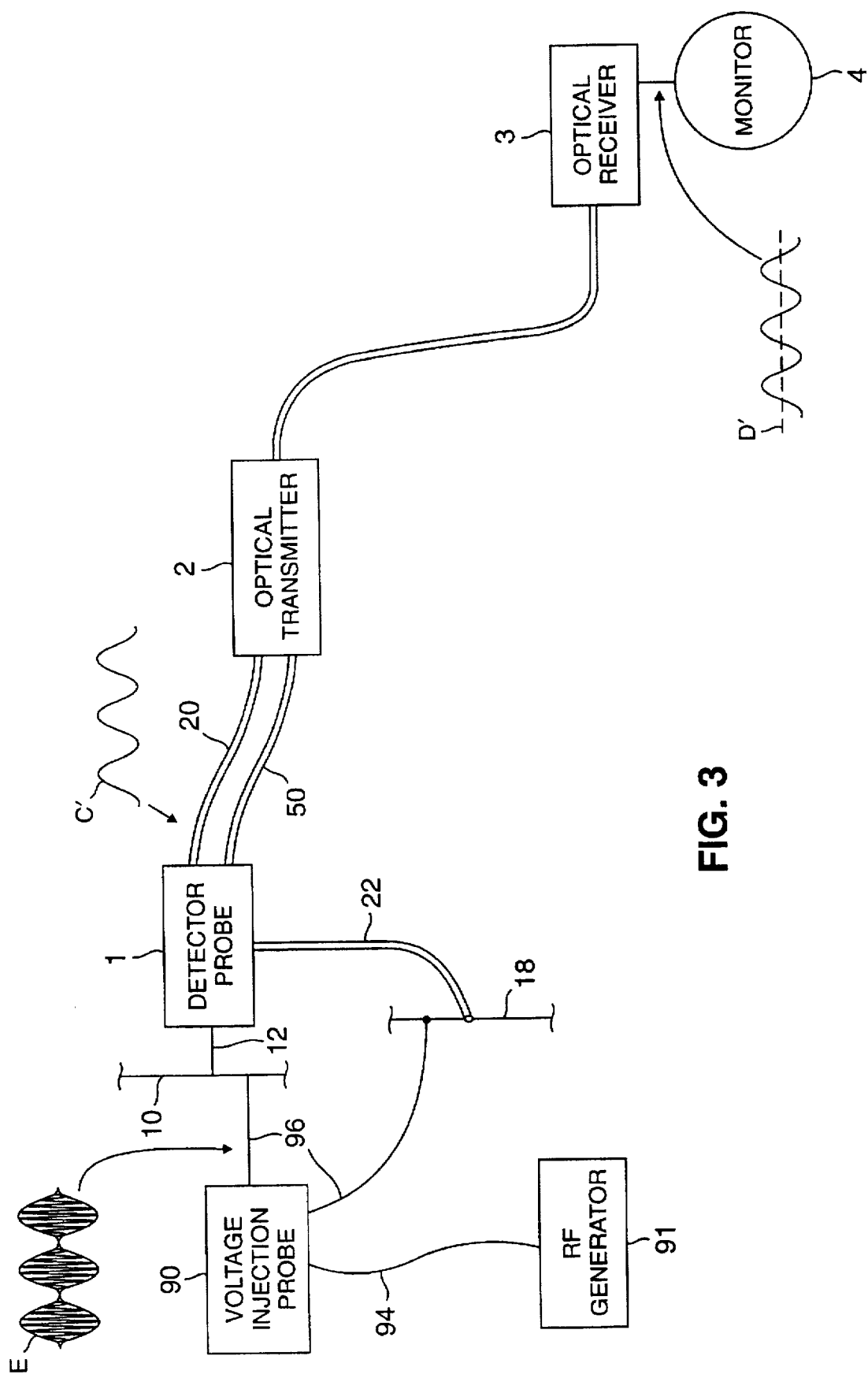
FIG. 3 is a diagram illustrating the use of the probe, non-metallic conductors and transmission link outside the shielded enclosure, to simulate the conditions within the shielded enclosure.

The system under test, the detector probe 1, the nonmetallic conductors 20, 22 and 50, and the optical transmitter 2 can then be moved out of the enclosure 5 as shown in FIG. 3. A voltage injection probe 90, driven by a standard RF generator 91, is connected to wires 10 and 18 of the system under test, as shown. RF generator 91 must employ the same modulation index (in this example 100%) as the RF generator 7 used in the screen room. Then, at each frequency at which the system failed, an amplitude modulated signal (signal E, FIGS. 2 and 3) is injected into the system using the voltage injection probe 90 to be described in detail with reference to FIG. 7, below. The modulation on the injected signal E is detected by the detector probe 1, and the voltage level is monitored by monitor 4, as discussed in connection with FIG. 1. The level of the injected signal (signal E) is then adjusted at generator 91 until the voltage level D' measured at monitor 4, is equal to the level D for that frequency measured in the shielded enclosure. When this level is reached, the controlled conditions of the shielded enclosure are essentially replicated outside of the enclosure. An EMI filter or other expedient can then be placed in an appropriate location in the system under test, and the signal at the level determined as discussed above, can be injected again into the system under test, to see whether the system still fails under such conditions. If it still fails, a different approach, such as a different filter, can be employed, and the process repeated until the system no longer fails. The generator 91 can then be adjusted to the next frequency (if any) at which the system failed in the shielded enclosure, and the above procedure repeated. It should be understood that the foregoing applies to a signal (signal F, FIG. 1) which is not amplitude modulated, whereby the detected signal in response to the injected signal is the same outside the enclosure as it was inside the enclosure for the carrier frequency at which failure occurred.

A specific embodiment of the circuitry employed in detector probe 1 in accordance with another aspect of the present invention, mounted on a microwave circuit board 40, will now be described with reference to FIG. 4. The clip or pin 12 (FIGS. 1 and 4) is connected to the anode of a zero bias Schottky detector diode 14, such as the HSCH-3486 leaded package or HSCH-3207 microstrip package, available from Hewlett-Packard, but other detector diodes can be used, depending upon desired frequency ranges, bandwidths and the like. The diode leads should be maintained as short as possible and may be painted with a reflective paint to minimize coupling of radiated fields into the diode leads. Preferably, the microstrip package diode leads should be used. The diode should be mounted using microstrip or mounting techniques for maintaining input impedance substantially constant over the frequency range of interest. One example of such a technique will be described with reference to FIGS. 5A–5B, below. Although the use of a zero bias Schottky detector diode is preferred, non-zero bias diodes can be used but require batteries within the shielded probe to provide an appropriate DC bias.

The anode of diode 14 is connected to pin 12, for insertion into lead 10 of the system under test, by conductor 38, and the cathode of diode 14 is connected to non-metallic conductor 20 by way of conductor 39 and connector 42. The cathode of diode 14 is also connected to non-metallic wire 22 by way of capacitor 44, resistor 46, connected in parallel with capacitor 44, conductors 39 and 48 and connector 43, which connects the conductor 48 and non-metallic conductor 22. Conductor 48 is also connected to non-metallic conductor 50 by way of Connector 52. The non-metallic conductors 20 and 50 are connected to an amplifier in the optical transmitter 2, such as the amplifier disclosed in FIG. 2 of U.S. Pat. No. 4,939,446, although the particular form of the amplifier is not critical, in which case non-metallic conductor 20 is applied to the "A" input terminal, and non-metallic conductor 50, is connected to the "G" (ground) terminal of the amplifier, the B terminal remaining unattached. Finally, the anode of diode 14 and the conductor 48 are connected to each other by way of parallel connected resistors 54a and 54b.

In operation, the capacitor 44 charges during conduction of diode 14, and the resistor 46 allows capacitor 44 to repetitively discharge as required to produce the detected envelope. The resistors 54a and 54b stabilize the input impedance to the diode over the entire input signal bandwidth, thus reducing the standing wave ratio at the diode to approximately 1.25.

With reference to FIGS. 5A and 5B, a specific implementation of the microwave circuit board 40 will be described, the same reference numerals being used in FIGS. 1, 3, 4, 5A, 5B, 6 and 7 to indicate corresponding elements. Pin 12 is mounted on conductor 38 which is formed of a 57-ohm microstrip trace. Diode 14 is mounted using standard microwave mounting techniques to the 57 ohm microstrip trade 38 at its anode, and at its cathode to conductor 39 which is formed of a copper conductor flange. The flange 39 flares outwardly from the diode as shown, to form a generally triangular shape, which reduces the inductance of the current path between the cathode of the diode and the connector 42 at high frequencies. Conductor 48 is formed of a copper ground plane, underneath a printed circuit board substrate 56 which electrically separates the conductor 48 from the conductor 38 and the copper flange 39. The ground plane immediately below the diode can be etched away to reduce the effect of diode chip parasitic capacitance and achieve the desired frequency response. The parallel resistors 54a and 54b are formed of two 114 ohm microstrip resistors which are deposited by thin film deposition techniques on the 57 ohm microstrip trace 38 and substrate 56, and are connected to the conductor 48 by way of gold foil wraparounds 58a and 58b.

Capacitor 44 is a feed-through capacitor of the flat tubular discoidal type, the outer case thereof being attached to conductor 48 by either soldering or bolting methods compatible with RF circuit design techniques. The resistor 46 is formed of a coil of non-metallic wire having a resistance of about 10K ohms, connected at its ends to connectors 42 and 52, as will be described, but alternatively, a resistor having a 10K ohm impedance can be employed. Alternately, the coil resistor 46 could be omitted.

Connector 42 is connected to flange 39 by way of copper block 60, which is soldered to the flange, connectors 43 and 52 are connected to the ground plane conductor 48 by way of copper blocks 62 and 64, respectively, soldered thereto, and pin 12 is connected to conductor 38 by way of copper block 66 similarly soldered thereto. Pin 12 should be less than about one centimeter in length and can be formed of any suitable sharp conductor, such as a portion of a needle, or the like.

Figure 6:
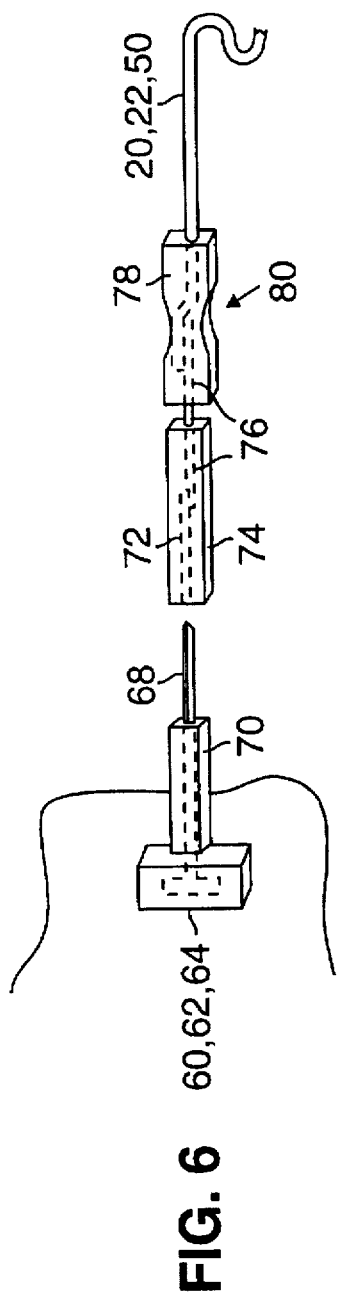
FIG. 6 is a diagram illustrating the detail of the connectors employed in the microwave circuit board implementation of FIGS. 5A and 5B.

The construction of the connectors 42, 43 and 52 will now be described in more detail with reference to FIG. 6. A male pin 68, such as the Dupont/Berg P/N 48116-000 is inserted into a plastic housing 70, such as the Dupont/Berg P/N 65039-036, to give rigidity to the pin 68, and the pin and housing are connected to the circuit board by way of a respective copper block 60, 62 or 64. The female receptacle 72, such as the Dupont/Berg P/N 47745-000, is inserted into an associated plastic housing 74, the same as or similar to housing 70, to add rigidity to the receptacle 72. A conductor 76, such as an 18-gage pin, is soldered to receptacle 72 and inserted into one end of a metallic sleeve 78. One of the non-metallic conductors 20, 22 or 50 is inserted into the other end of metallic sleeve 78 so that it overlaps conductor 76, and the metallic sleeve is crimped at 80 in order to conductively connect the conductor 76 to the non-metallic conductor. In the case of connectors 42 and 52, the respective ends of the resistive coil 46 are inserted into the metallic sleeves 78 along with non-metallic conductors 20 and 50, as shown in FIG. 5B.

Returning to FIGS. 5A and 5B, although not shown to scale, the circuit board 40 will be approximately one-half inch wide, one inch long and one-quarter inch deep. The circuit trace lengths, depths and widths can be determined by those skilled in the art through standard RF design analysis. The circuit board, along with the components thereon, is preferably disposed within a standard RF shielded oscilloscope type probe assembly. Preferably, the connectors 42, 43 and 52 are also disposed within the shielded probe assembly, but if not they should be separately shielded.

As mentioned above, the non-metallic conductor 20 can be attached to the A input of the amplifier disclosed in the above referenced patent, and non-metallic conductor 50 can be applied to the ground input thereof. Both conductors 20 and 50 can be connected to the amplifier by way of standard shielded BNC connectors 82 and 84, respectively.

The needle 12 is inserted into a system wire 10, and the non-metallic conductor 22 is provided with a needle or pin 86 which is inserted into one end of an associated metallic sleeve 88, the other end of which receives conductor 22. The metallic sleeve 88 is crimped, in a manner similar to that shown in FIG. 6 with respect to metallic sleeve 78, in order to electrically connect the pin 86 to the conductor 22. The pin 86 is inserted into system ground wire 18. Optionally, with respect to FIG. 5B, the ground input may be directly connected to system ground wire 18 by a non-metallic conductor (not shown) and pin 86 such that conductors 22 and 50 and connectors 43 and 52 are eliminated and ground plane 48 is allowed to float.

Figure 7:
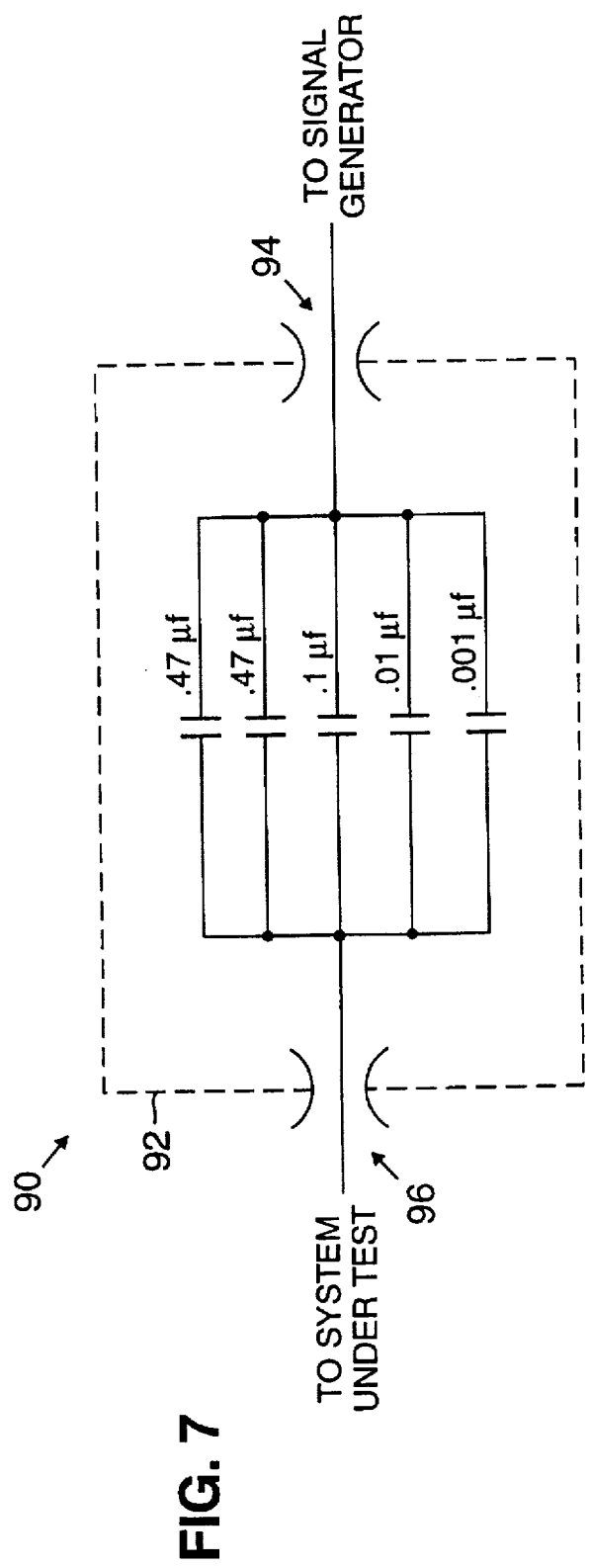
FIG. 7 is a schematic illustration of circuitry employed in voltage injection, in accordance with another aspect of the present invention.

In accordance with another aspect of the present invention, the RF voltage injection probe 90 will be described with reference to FIG. 7. The injection probe is used to inject radio frequency voltages from a standard signal generator (generator 91, FIG. 3) into the system under test in accordance with the test procedures described above. The injection probe is housed in a metallic RF shielded housing 92 and is connected at its input to a standard signal generator, for generating approximately 10 KHz to 18 GHz, amplitude modulated signals by way of coaxial cable 94. The output of the injection probe is connected to wires 10 and 18 of the system under test, by coaxial cable 96, the cable shielding being connected to the housing 92 through the use of standard BNC connectors. Coaxial cable such as that designated RG 58 can be employed, and standard BNC connections can be employed for connection of the cables to the injection probe 90. The connection between the probe 90 and the system wires 10 and 18 can be made with the use of test clips such as those provided by ITT Pomona Electronics, Model Nos. 5188 or 3788, for example. The BNC connectors carry the shield as a ground return.

The injection probe 90 is comprised of five parallel connected capacitors, in this example. Specifically, the 0.47 microfarad capacitors are, in this example, paper type capacitors which function to pass signals between approximately 10 KHz and 100 KHz. The 0.1 microfarad. capacitor is, in this example, a plastic type capacitor designed to pass frequencies between about 100 KHz and 20 MHz, and the 0.01 and 0.001 microfarad capacitors are, in this example, of the silver mica type that pass signal frequencies between about 20 MHz and 150 MHz. The coaxial connectors on the shielded housing 92 should incorporate coaxial feedthrough connectors that pass frequencies above approximately 150 MHz.

Injection probe 90 thus comprises a number of parallel capacitive paths for injecting voltages over the desired frequency range, each capacitive path handling a particular frequency range. By employing the injection probe 90, the desired level of voltage for producing voltage level D', in FIG. 2, can be readily achieved using a standard signal generator, without requiring expensive bulk current injectors.

The injection probe frequency response characteristics are automatically compensated for since the voltage output from generator 91 (FIG. 3) is adjusted until the correct voltage level is injected into system, as determined by monitoring the detected output, as discussed above.

Figure 8:
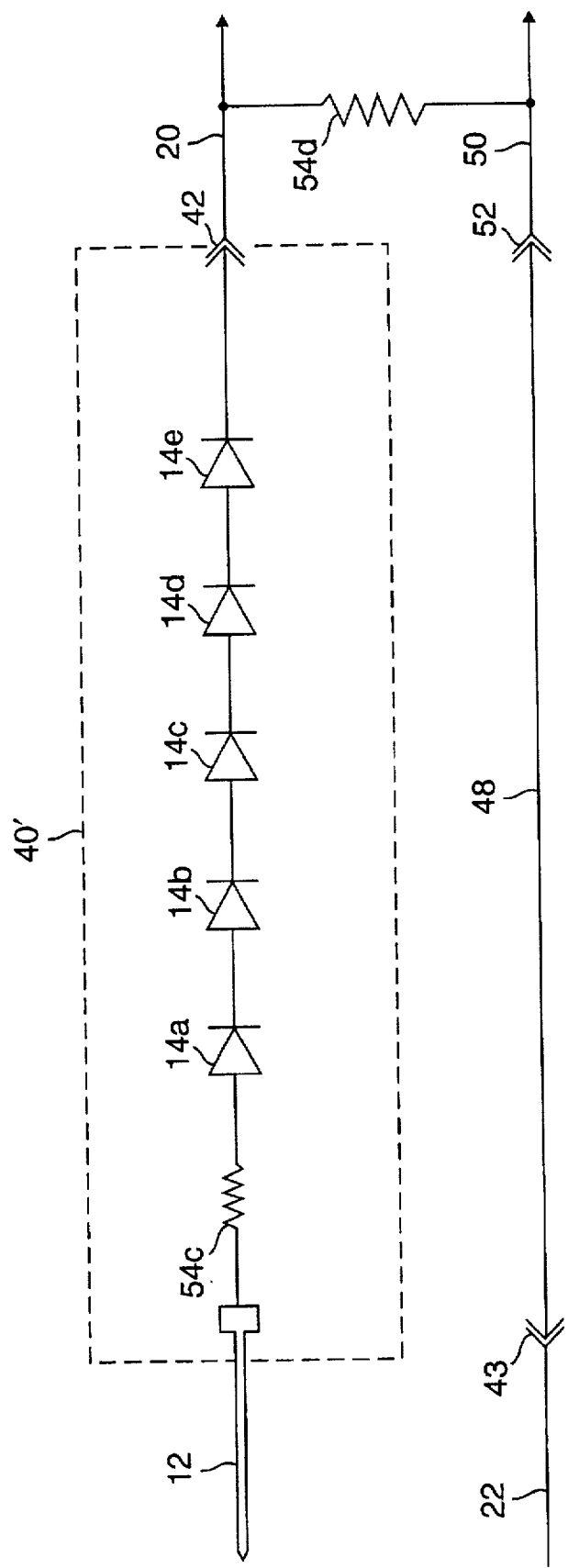
FIG. 8 is a schematic diagram illustrating a specific embodiment of the low cost detector probe circuitry used in accordance with an embodiment of the present invention.
Figure 9A:
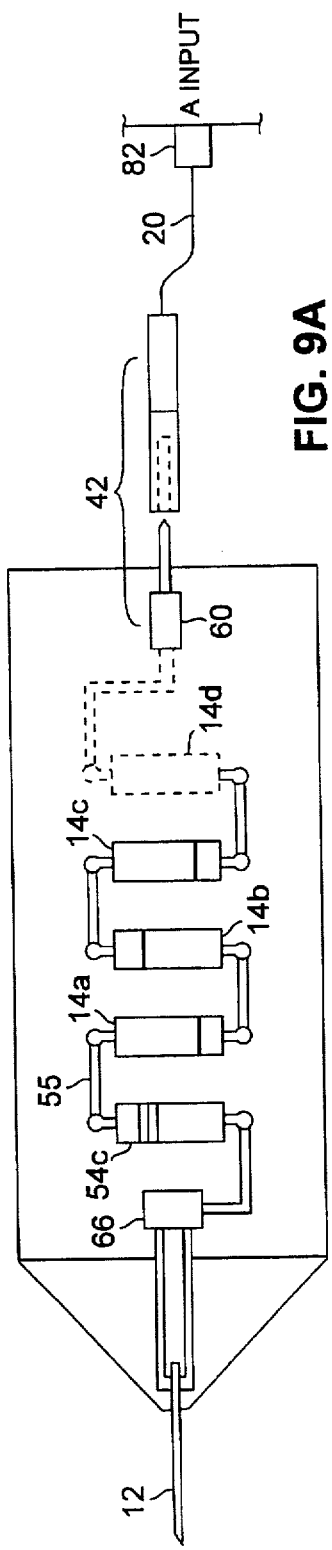
FIGS. 9A and 9B illustrate an example of the printed circuit board implementation of the circuitry illustrated in FIG. 8.
Figure 9B:
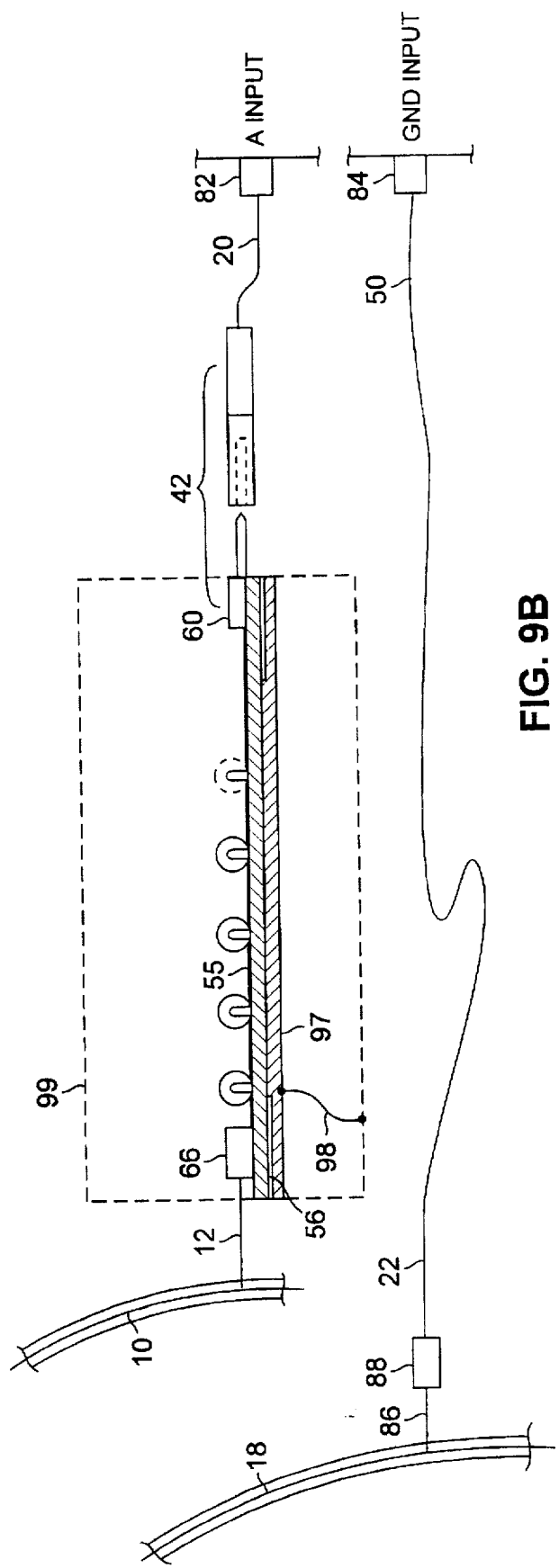

With reference to FIGS. 8, 9a, and 9b, a specific embodiment of circuitry employed in detector probe 1 in accordance with yet another aspect of the present invention, is shown. This implementation will be described using the same reference numerals that are used in FIGS. 1, 3, 4, 5a, 5b, 6 and 7 to indicate corresponding elements, to the extent appropriate. In this embodiment, the detector probe 40' is fabricated using conventional circuit board construction techniques and is suitable for use for the narrower bandwidth of from 10 KHz to 1.4 GHz.

Referring to FIG. 8, the clip or pin 12 is mounted on printed circuit board 40' and connected to the anode of a zero bias Schottky detector diode 14a, as described above. The cathode of detector diode 14 is connected to connector 42. A second probe 48 is connected between the ground input 84 of the instrumentation and the ground referenced 18 of the device under test for the wire 10 that is being monitored. Printed circuit board 40' also includes a ground plane 97 (not shown in FIG. 8) which is allowed to float. Alternately, ground plane 97 and conductor 48 may be the same element, connected in the manner illustrated in FIG. 5B. In the embodiment shown in FIG. 8, a series resistor 54c is interposed between pin 12 and the anode of diode 14a. This resistor 54c works together with diode load resistor 54d, which is placed in parallel across the probe conductor 20 and conductor 48 outputs to provide for input voltage attenuation, if any is required. Resistor 54c may be an arbitrary series microstrip resistor. Resistor 54d may be a high resistance such as 100 KΩ to 1 MΩ resistor which is provided to improve the performance of diode 14a. With this construction, resistors 54c and 54d form a voltage divider that can be selected to allow use of a single diode 14a to monitor high RF voltage levels, peak-to-peak, in wire 10 of the device under test.

In a preferred embodiment, resistors 54c and resistor 54d are omitted and instead a string of Schottky diodes, placed in series, are used. The conventional Schottky diode cannot withstand more than an 4 volt reverse bias signal. Consequently, when monitoring RF input voltage greater than 8 volts peak-to-peak and a voltage divider is not used, additional series diodes are required to distribute the voltage drop. For example, ten series diodes are required to withstand an 80 volt peak-to-peak signal at the probe input. In addition, it was discovered that using a conventional series resistor mounted on a conventional printed circuit board (i.e., not a microstrip printed circuit board) will allow frequencies above 29 MHz to blow by the resistor without any attenuation. This was discovered not to occur with the use of a plurality of series Schottky diodes. Accordingly, in the preferred embodiment, the lower bandwidth circuit shown in FIG. 8 typically includes an arbitrary number of series diodes, of which five are illustrated as diodes 14a, 14b, 14c, 14d, and 14e, mounted on a conventional printed circuit board 40'.

The circuit board layout is shown in FIGS. 9A and 9B. Ground plane 97 is typically oriented on its underside and is connected to a copper shield 99 by a lead 98. This is shown in FIG. 9b. As noted, the copper ground plane 97 and copper shield 99 are generally allowed to float, but may be grounded, whereupon if resonance occurs, then the shield 99 and groundplane 97 should be allowed to float.

The number of Schottky diodes 14 that can be placed in series on a non-striped line type printed circuit board is limited by the dimension considerations with respect to the excitation frequency and resonance. For example, the maximum length of the printed circuit board should not be greater than about 2 centimeters when operating at 1.4 GHz. In the event that a stripline printed circuit board is used, this limitation does not apply and any number of diodes may be used. Accordingly, as illustrated in FIGS. 9a and 9b, diodes 14a–14e are illustrated as mounted side by side in order to minimize the length of the printed circuit board. In fact, the diodes may be mounted in touching contact side to side, with the anode and cathode leads as short as possible, as previously described. The printed circuit board traces are illustrated in FIGS. 9a and 9b by the reference 55. It is noted that 24 Schottky diodes may be mounted on circuit board 40' although only five such diodes are shown. Copper shield 99 envelops circuit board 40' in electromagnetic isolation from the circuit path between pins 12 and 60.

Figure 4:
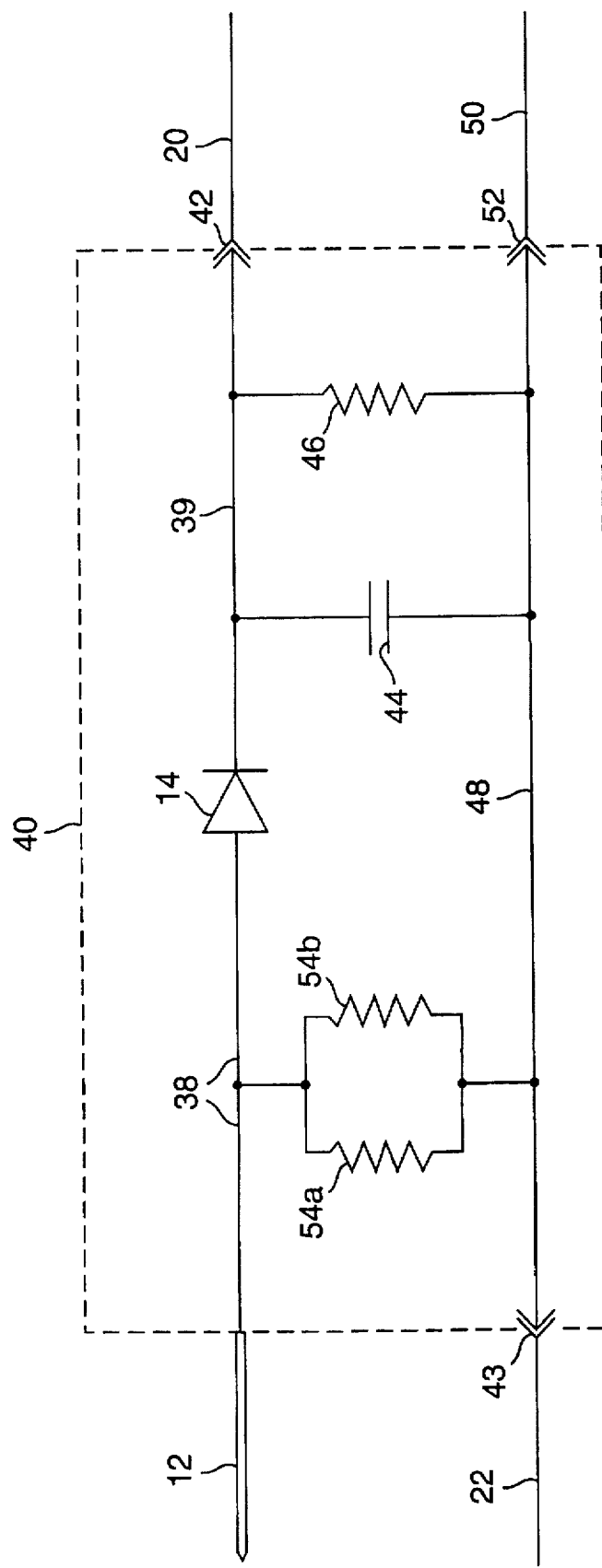
FIG. 4 is a schematic diagram illustrating a specific embodiment of the detector probe circuitry used in accordance with the present invention.

One of the advantages of the probe illustrated in FIGS. 8, 9a, and 9b is that it has a substantially lower cost than the RF probe illustrated in FIGS. 4, 5a, and 5b. This is in part due to the bandwidth limitation of the RF probe.

In accordance with another aspect of the present invention, the plurality of RF probes (any version) may be used to monitor a corresponding plurality of test wires in the device under test. For example, a system containing sixteen probe outputs (or more or less) could be used. Such a system may have sixteen parallel outputs to respective display devices such as a strip chart recorder or may more preferably include a multiplexor-demultiplexor system that uses a single optical link for transmitting the multiplexed information external of the shielded enclosure.

Figure 10:
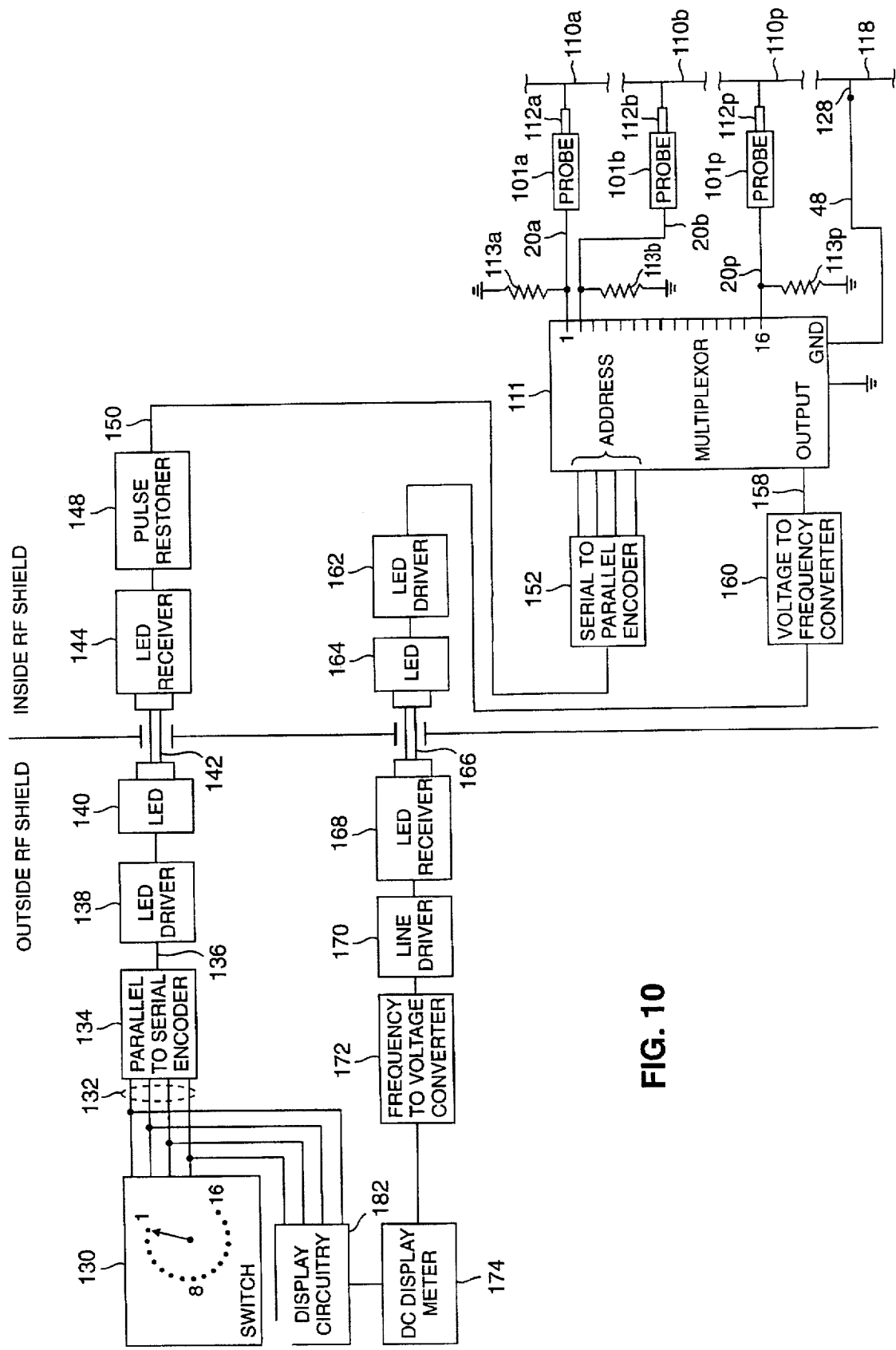
FIGS. 10, 11A and 11B, 12, 12A and 12B are respectively four different embodiments of a multiplexor-demultiplexor system for monitoring a plurality of wires of a device under test using the probe of FIG. 8.

Referring now to FIG. 10, a control system for an operator to select manually one of a plurality of low cost RF voltage probes 101 to be monitored, one probe at a time, is shown. In this embodiment, sixteen probes labeled probes 101a through 101p are illustrated (the letter suffixes are used to distinguish the otherwise identical probes), each probe having a pin 112 for inserting into a test wire 110 of device under test. In this regard, the device under test may be a wire harness for use in an automotive vehicle, a circuit having one or more component parts interconnected, a printed circuit board or combinations of printed circuit boards and/or device. It is noted that it is not necessary to have the device under test operational when measuring RF voltage levels in the wires of the device under test.

Each of the probes 101a–101p is connected to a multiplexor 111 by a conductor 20 in parallel with a resistor 113 passed to ground, e.g., 750 KΩ. It is desirable to match the impedance of the probe conductor 20 to the input of multiplexor 111. In a preferred embodiment, as illustrated in FIGS. 11A and 11B, 12, 12A and 12B, an operational amplifier 117 in a voltage follower configuration and a 1 kΩ resistor 119 may be used. Thus, for a ten foot length of conductor 20, which has an impedance of about 250 Kohms, the impedance at the output of the op amplifier is about zero, thus providing the desired impedance isolation.

Returning to FIG. 10, associated with each conductor 20 is a second conductor 48 which is used to connect the ground return wire 118 related to the wire 110 of the device under test being monitored, to the ground potential the monitoring circuit instrumentation. In devices under test having a single ground return 118, a single conductor 48 may be used to connect that ground 118 to the ground of the instrumentation. However, when a plurality of ground returns 118 exist in the device under test, as occurs, for example, in an automobile wiring harness, then each wire 110 must be monitored with reference to its corresponding ground return 118.

Figure 12:
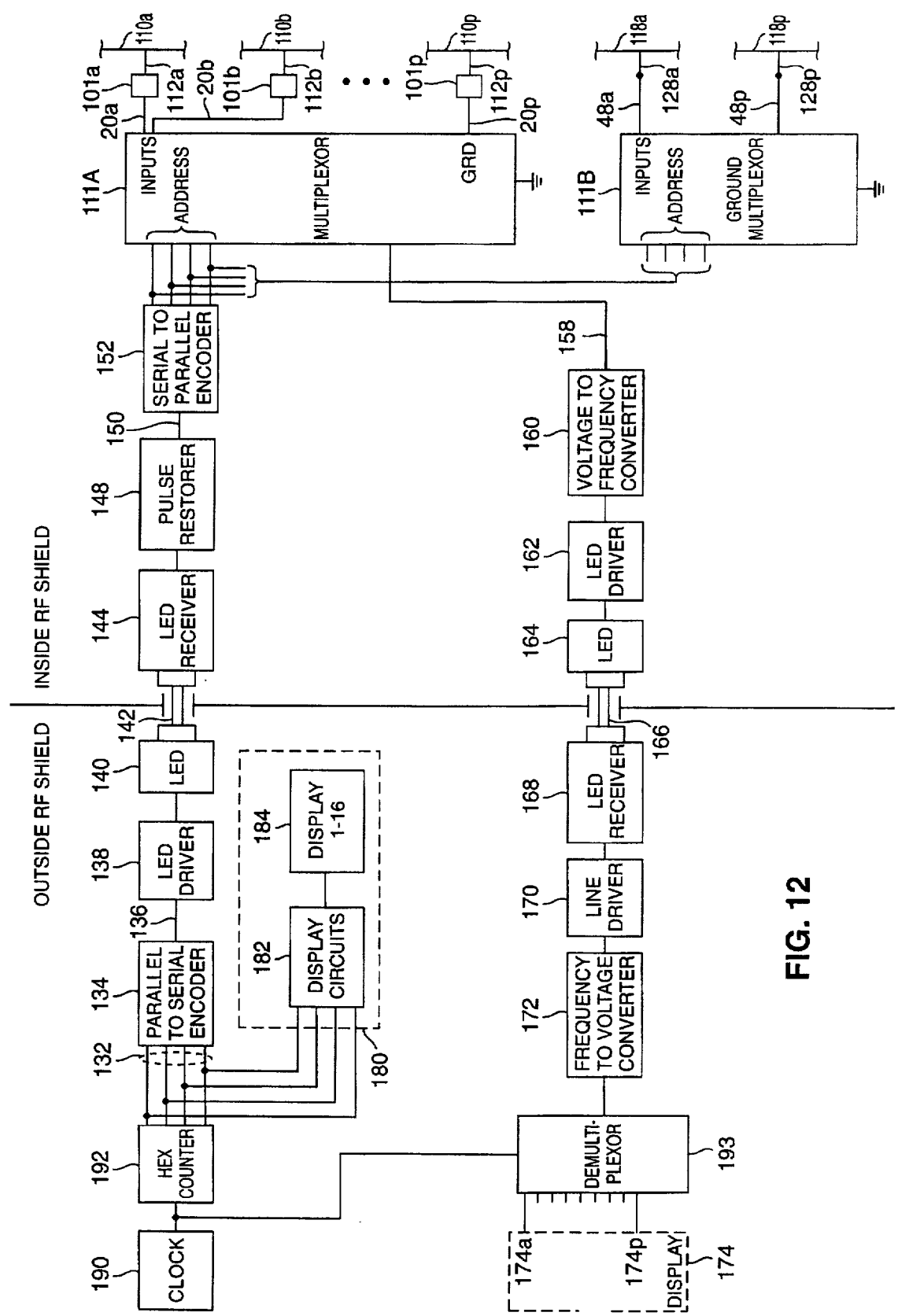
Figure 12A:
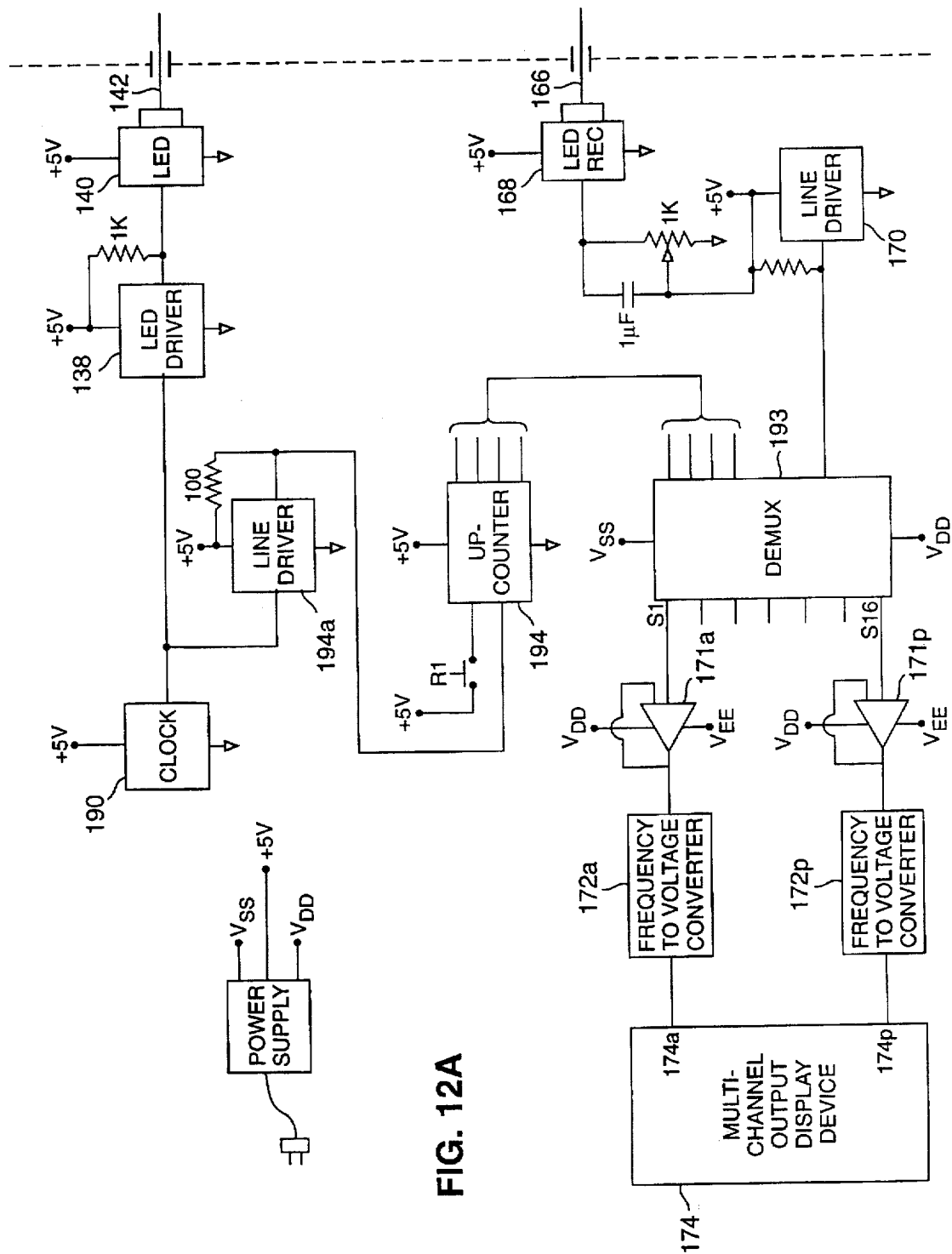
Figure 12B:
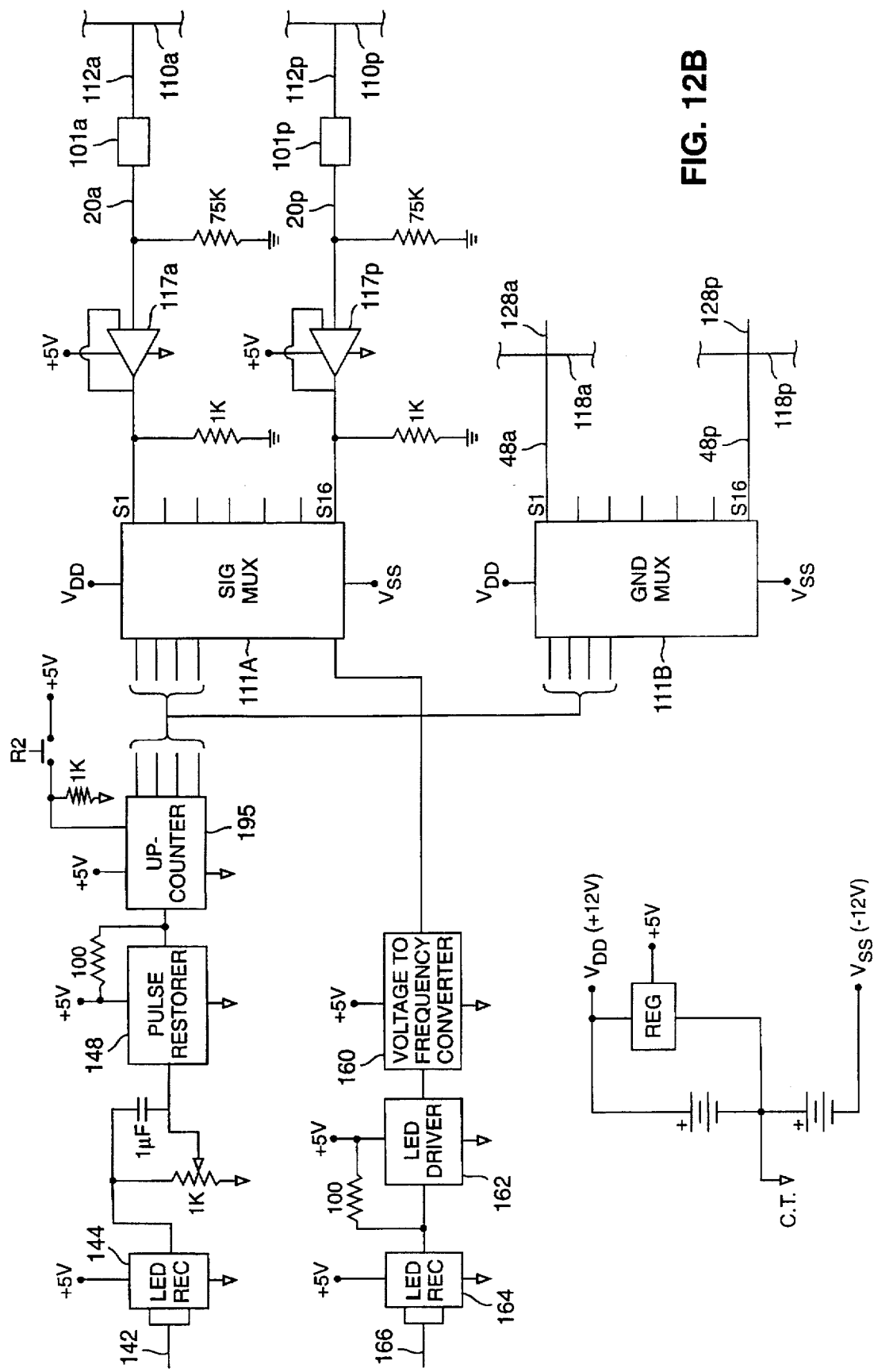

In one embodiment, illustrated in FIGS. 12A and 12B, and which may be incorporated into the other embodiments described herein, this may be achieved by including a second multiplexor 111B having a plurality of inputs for receiving the respective grounds 118a–118p for the wires 110a–110p, and an output that is connected to ground potential of the instrumentation, i.e., the center tap between the two +12 volt batteries described herein. Each ground wire 118 is coupled to the multiplexer 118B input by a corresponding conductor 48a–48p having a pin 128a–128p passing into wires 118a–118p, and multiplexor 111B is addressed in synchrony with multiplexor 111A with the same input select address so that the instrumentation ground is always tied to the ground return of the circuit under test for the selected probe 101x. In the case that several wires 110 being monitored have the same ground return 118, then only one conductor 48 is required, provided that the corresponding inputs of multipelxor 111B are jumpered to the one conductor 48.

Multiplexors 111A and 111B may be a sixteen to one multiplexor having a parallel four bit address input select for controlling the input to output connection, and are collectively illustrated as multiplexor 111 on FIG. 10. A suitable multiplexor is Model AD7506 available from Analog Devices which may be used for both multiplexors 111A and 111B, and for the demultiplexor 193. Other multiplexor devices also could be used.

The system shown in FIG. 10 includes a thumbwheel switch 130, that controls a multiplexor address line including a multi-bit parallel data bus 132, a parallel to serial converter 134, a serial data bus 136, a driver amplifier 138, and a light source 140 coupled to an optical fiber 142. The foregoing elements are located outside of the shielded enclosure. The multiplexor control line also includes optical fiber 142 passing through the shielded wall into the shielded enclosure and connecting to a photodetector 144, to a pulse restorer 148 which provides a four bit serial output on lead 150, and a serial to parallel encoder 152. The output of the serial to parallel encoder 152 is then provided to multiplexor 111 for selecting the input of multiplexor 111.

The output of multiplexor 111 is connected to an RF voltage measurement link including a voltage to frequency converter 160 on lead 158, which provides an output to a driver amplifier 162, which in turn drives a light source 164 coupled to an optical fiber 166. These elements are inside the shielded enclosure. The RF voltage measurement link also including the optical fiber 166, which passes out of the shielded enclosure and is coupled to a light receiver 168, which is in turn connected to a line driver amplifier 170, which is connected to a frequency to voltage converter 172. The output of converter 172 is then provided to a display device 174. In addition, the output of switch 130 may be connected to display device 180 which includes display circuits 182 and a display device 184. In the preferred embodiment, light emitting diodes (LED) are used to transmit the signals through optical fibers 142 and 166. Accordingly, the same LEDs may be used for light sources 164 and 140, the same LED driver amplifiers may be used for drivers 138 and 162, and the same light detectors 168 and 144 may be used to receive the light transmitted from the LEDS.

In this embodiment, the control switch 130 permits the operator to select any one of the sixteen probes 101a–101p by appropriate movement of the switch. Thus, the radiated susceptibility test is performed normally and the device under test is evaluated for susceptibility to the particular frequency and electromagnetic field level where susceptibility occurs. Following the radiated susceptibility test, the plurality of probes 101 may be connected to the DUT for the same diagnostic purposes. In this regard, the operator turns the device under test off and the operator then regenerates the electromagnetic field frequency and voltage level that cause susceptibility during the radiated susceptibility test and selectively monitors each RF probe, or only those probes of interest, by turning switch 130 to the selected positions illustrated 1–16 on FIG. 10. The ability to monitor selectively the probe outputs eliminates the requirement to open and close the RF enclosure door and moving a single probe 1 as illustrated in FIG. 1, from one wire of the device under test to another wire. This substantially shortens the time required to identify the areas in the device under test where susceptibility is occurring and thus shortens substantially the time required to locate and cure the problem in the device under test.

When the operator selects a specific position on switch 130, that switch provides a parallel four bit output corresponding to that position. The four bits are then converted to serial bits by encoder 134. The serial bits are then transmitted by LED 140 over fiber 142 and received inside the shielded enclosure by detector 144. The detected signals are restored as pulses by restorer 148 and converted back into a parallel word by encoder 152. The four bit word provided from switch 130 is then used to control multiplexor 111 to select the corresponding probe 101x (x corresponding to the switch positions 1–16 (corresponding to letters a–p)). Output of the probe selected is then provided from the output of multiplexor 111. That output voltage, which may be a DC level or an amplitude modulated signal, is then converted to a frequency by voltage to frequency converter 160 which operates driver amplifier 162 to stimulate LED 164 to pass that signal out of the shielded enclosure on cable 166. Voltage to frequency converter 160 typically provides for converting the DC voltage level on lead 158 to a corresponding frequency of between 0 and 100 KHz depending on the magnitude of the DC signal. It is noted that the output DC level is latched and hence remains constant as long as switch 130 remains in the selected position and the excitation frequency and strength is not changed. Once switch 130 is turned to a different position, the output displayed on meter 174 will change in response to the 4 bit code corresponding to the desired probe 101x.

The passed signal is then detected by detector 168, amplified by amplifier 170, and converted back into a voltage by converter 172. Frequency to voltage converter 172 applies a DC signal to meter 174 which is proportional to the DC level at the output of probe 101x. The voltage is then displayed on meter 174.

Figure 11A:
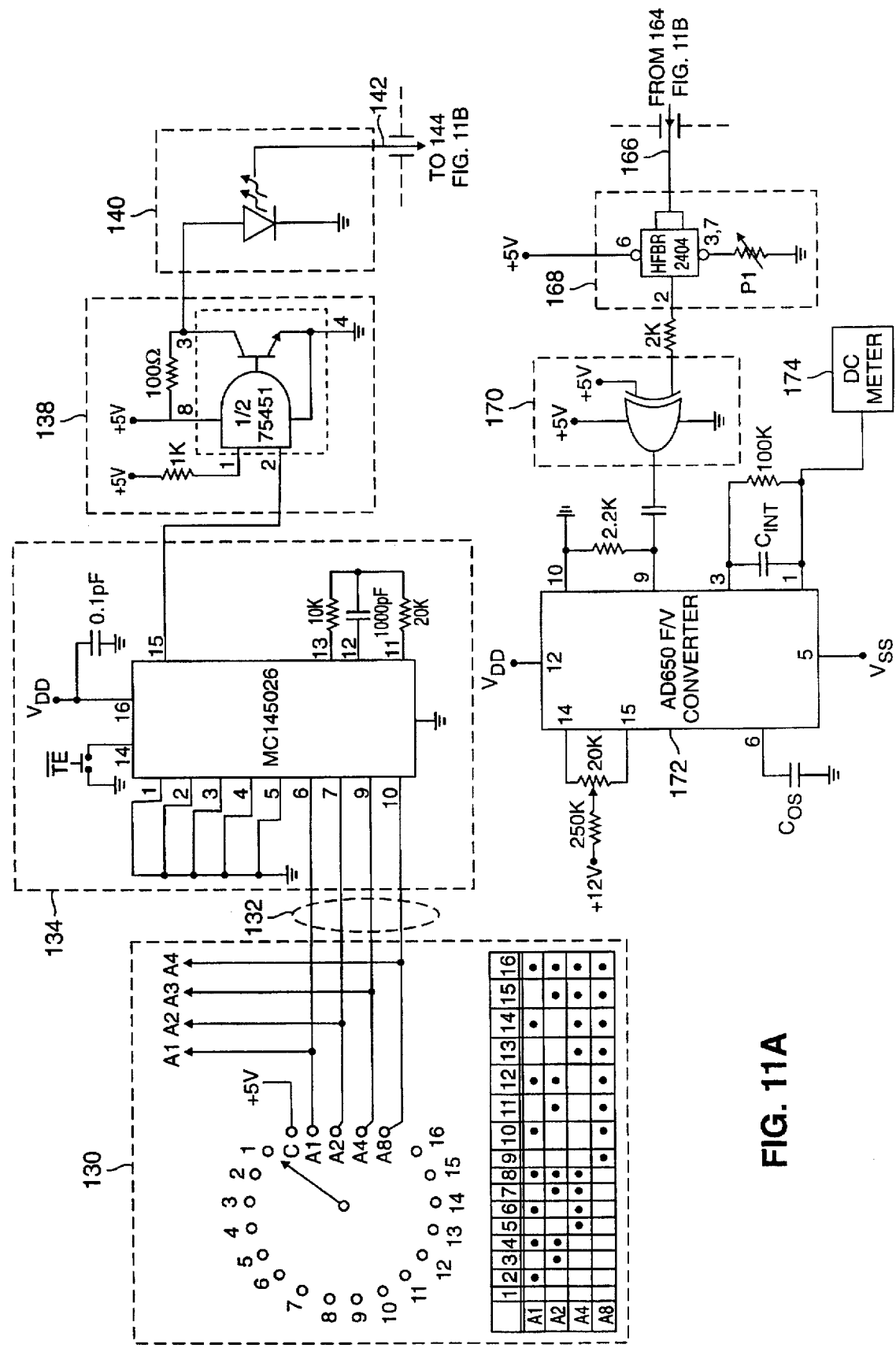
Figure 11B:
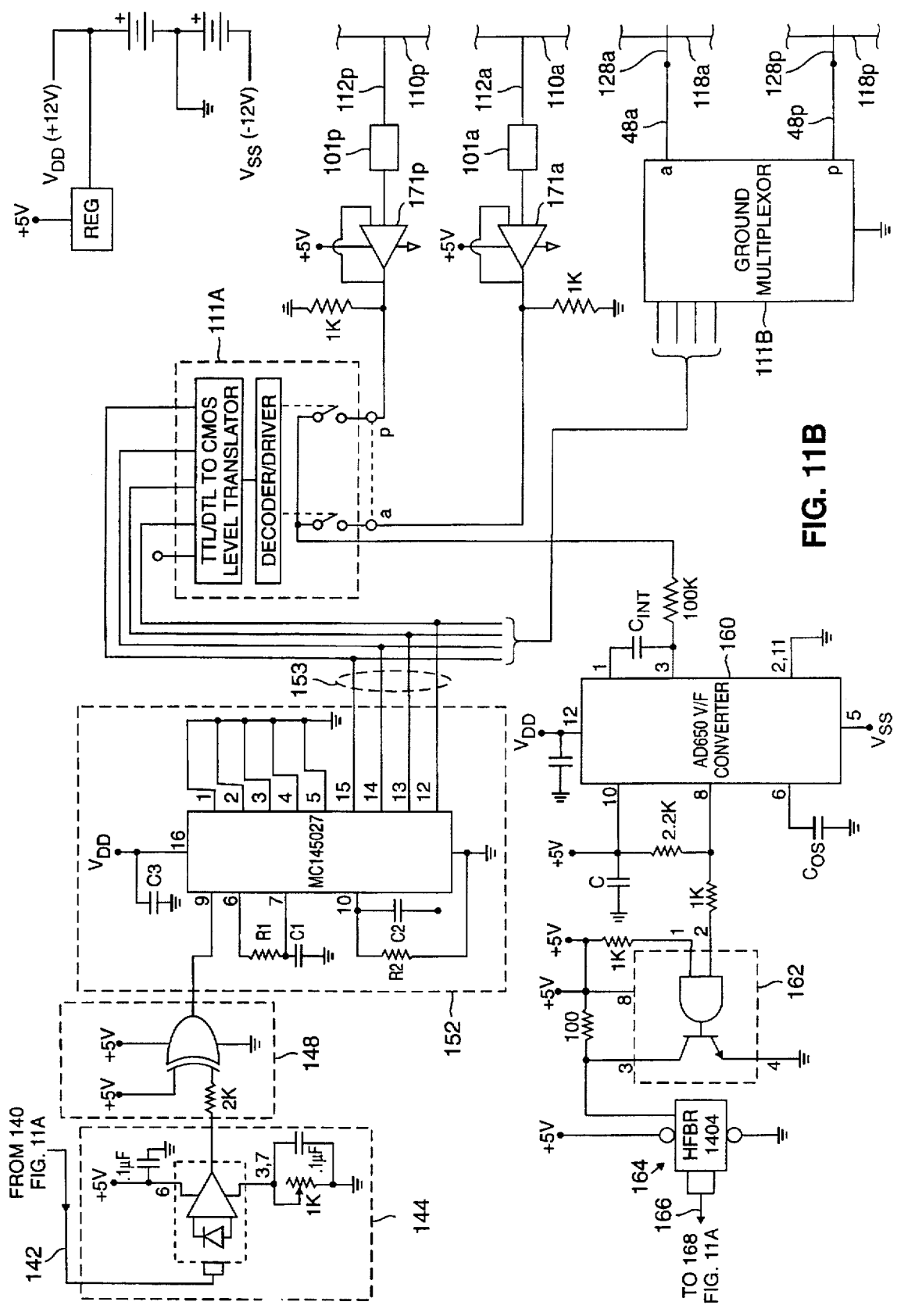

Referring now to FIGS. 11A and 11B, a circuit schematic for the multiplexor system illustrated in FIG. 10 is shown in FIG. 11A illustrating the portion outside the RF shielded enclosure and FIG. 11B illustrating the portion inside the RF shielded enclosure. In the embodiment, switch 130 is a rotary thumbwheel switch, for example, Model DRKR16H available from NKK. The switch has 16 positions and a four bit output illustrated as bits A1, A2, A3, A4. The position to output bit table is illustrated. Parallel to serial encoder 134 may be a Model MC145026 available from Motorola. This circuit is configured substantially as illustrated on FIG. 11 to convert the parallel input from switch 130, which input is maintained as long as switch 130 is not changed, to a serial output. The serial output is then passed through LED driver 138 which may be a Model ½ 75451 device available from Motorola. The device includes a NAND gate and a transistor with the output of the transistor being the input to LED 140. The driver circuit 138 is connected substantially as shown using +5 volt DC inputs to pins 1 and 8, a 100 Ω resistor connected between pins 8 and 3 and pin 4 connected to ground. Pin 2 of the device receives the serial output from encoder 134. Output pin 3 is connected to the anode of light source 140, in the case a light emitting diode Model HFBR1404 available from Hewlett Packard. The output of LED 140 is coupled to an optical fiber cable. The cable passes inside the shielded structure and to a photodetector 144 which is a Model HFBR2404 optical receiver, available from Hewlett Packard. Pin 6 of device 2404 is connected to a +5 volt DC source and a 0.1 microfared capacitor which is grounded. Pins 3 and 7 are tied together and connected to a 1 KΩ potentiometer in series with a 0.1 microfared capacitor. The potentiometer is used to drive the LED with the digital control circuitry. The output of device 2404 is passed to pulse restorer 148 which may be a Model ¼ 74LS86 available from Motorola. This device is a exclusive OR gate having a +5 volt DC reference for restoring the optical pulses to uniform pulse level of 5 volts. The output of pulse restorer 148 is passed to serial to parallel encoder 152 which may be Model MC145027, available from Motorola. Encoder 152 converts the serial input from pulse restorer 148 to a parallel output on bus 153. The device MC145027 is configured as illustrated on FIG. 11 in the conventional manner to provide the parallel output. Resistor R1 is 10 Kohms, resistor C1 is 3900 picofarads, resistor R2 is 100 Kohms, capacitor C2 is 7500 picofarads, capacitor C3 is 0.1 microfarads. The four bit output is then passed to multiplexor 111 which is preferably a Model AD7506 available from Motorola. The output of multiplexor 111 is in turn provided to a voltage to frequency converter 160 which is preferably a Model AD650 available from analog devices. The signal is passed across 100 KΩ resistor into pin 3 of converter 160 and pins 3 and 1 are connected across an input capacitor. The output of converter 160, specifically pins 8 and 10 are connected by a 2.2 KΩ resistor to +5 voltage DC source and passed to ground across a capacitor. The output signal is in turn fed across a 1 KΩ resistor to the input of driver amplifier 162. Amplifier 162 is preferably a TTL driver Model DS75451 available from Motorola. This device is configured in a conventional manner with the +5 voltage source connected across a 1 KΩ resistor to input 1 and connected directly to pin 8.

The output of the driver 162 is input to optical transmitter 164, preferably a Model HBFR1404 LED as described. The optical signal is received by detector 168, which may be a Model HFBR2404. In this embodiment, pins 3 and 7 of the device are connected to ground across a potentiometer P1. The value of potentiometer P1 is selected to provide for the device operating into a logic gate such as line driver 170. Line driver 170 is preferably a ¼ 74LS86 line driver configured the same as driver 148 previously described. The output of driver 170 is provided to a frequency to voltage converter such as analog devices Model AD650. The output of converter 172 is provided to meter 174 which may then display the DC level of the monitored wire of the device under test. In the embodiment illustrated, two +12 volt supplies are used with a center tap common ground return. Hence, the reference voltage VDD is +12 volts, the reference voltage VSS is -12 volts, and the signal ground is 0 volts. The +12 volt source also is regulated down to a +5 volt supply for use as illustrated. In all cases, the pin numbering of the devices are those provided by the manufacturers identified, unless otherwise indicated.

Referring now to FIG. 12, an alternate embodiment of the multiplexor system is shown. In this case, the same reference numerals used in FIGS. 10 and 11 correspond to the same circuit devices and manner of operation. In this embodiment, in place of switch 130, a clock 190 and hexcounter 192 are provided. In addition, in place of meter 174, a demultiplexor 193 and a plurality of meters 174a–174p are provided.

In this embodiment, hexcounter 192 is a device having a four bit parallel output, e.g., Model No. MC14520B available from Motorola. The output code is provided to the parallel to serial encoder 134. Clock 190 is used to control hexcounter 192 to sequence each of the four bit outputs to sample each of the probes 101a–101p at the clock rate. Similarly, clock 190 is used to control demultiplexor 192 to display the outputs of each of probes 101a–101p on the appropriate meter 174a–174p one at a time. Thus, the hexcounter 192, clock 190, and demultiplexor 192, and display meters 174a–174p provide for automating the manual operation described in FIG. 10 and 11. By using a sufficiently fast clock, each of meters 174a–174p will provide apparently simultaneous display of the DC output of each of probes 101a–101p.

Referring to FIGS. 12A and 12B, a preferred embodiment of the present invention is shown, in which the same reference numerals used in FIGS. 10–12 correspond to the same circuit devices and manner of operation. In this embodiment, with reference also to FIG. 12, in place of hex-counter 192 and parallel to serial encoder 138, a binary up-counter 194 is used, located outside of the shielded enclosure, and in place of the serial to parallel encoder 152 inside the shielded enclosure, a second binary up-counter 195 is used. In this embodiment, clock 190 operates up-counter 194 to count at the clock rate, e.g., 50 KHz. This provides the sequence of four-bit words that sequentially address demultiplexor 193. A line driver amplifier 194a is inserted between clock 190 and up counter 194. The output of clock 190 also is passed over driver 138 and LED 140, and this is optically transmitted inside the shielded enclosure and recovered by detector 144 and pulse restorer 148. The output of pulse restorer 148 is thus the clock rate and causes up-counter 195 to count at the same rate as counter 194. Thus, the two counters are in synchronism and operate both multiplexor 111 (multiplexors 111A and 111B where appropriate) and demultiplexor 193 in synchronism.

In the embodiment illustrated in FIG. 12A and 12B, with the outside components in FIG. 12A and the inside components in FIG. 12B, frequency to voltage convertor 172 is located in series with a voltage follower amplifier 171a between each output of multiplexor 193 and each channel of a multichannel display device 174. This parallelism is a design choice which is an alternative to using a single frequency to voltage convertor 174 at the input end of multiplexor 193 as shown in FIG. 12.

The center-tapped power supply of two +12 volt rechargable batteries to produce Vdd (+12 v) and Vss (−12 v) and a five-volt voltage regulator REG are illustrated in FIG. 12A. Also shown are 1 μf and 1 KΩ potentiometers at the output of the LED receivers 144 and 168, and reset switches R1 and R2 for manually resetting counters 194 and 195, respectively.

It is to be understood that delay circuits (not shown) may be introduced to provide for maintaining the outputs of counters 194 and 195 in synch with clock 190. Hence, the outputs of the plurality of probes 101 are automatically displayed on the corresponding output device 174, e.g., a display meter or a strip chart. The voltage to frequency convertor circuits 160 and 172 may be model AD 650, available from Analog Devices, or model VFC 110. The op amps 117 and 171 may be model AD 843JN, available from Analog Devices. The multiplexors 111A, 111B and 193 may be model AD 7506 available from Analog Devices or model MPC800 available from Motorola. The up-counters 194 and 195 each may be model MC14520B, available from Motorola. The LEDs 140 and 164 may be model HFBR1404 and the LED receivers and 168 may be models HFBR2406. One advantage of this embodiment is that the multiplexor control channel is simplified to only providing a clock rate.

In yet another embodiment, not shown, the multiplexor control channel may omit any control circuits outside of the shielded enclosure and the optical transmission elements such that clock 190 is directly connected to counter 195 for controlling the selection of the probe. In this embodiment, it is necessary to recover the clock signal from the voltage signal transmitted over cable 166. This may be done by, for example, interposing a logic circuit that changes state with every clock pulse so that the change of state can be recovered external to the shielded enclosure and used to generate the clock for addressing the demultiplexor 193 in synchrony with multiplexor 111. Other techniques for modulating the clock signal onto the data signal for transmission out of the shielded enclosure may be used.

It should be understood that alternate forms for multiplexing could be used. For example, in place of time multiplexing described in connection with FIG. 12, a frequency multiplexing system could be used. In this case, each of probes 101a–101p would be connected to an LED driver having a different frequency and the frequencies multiplexed onto a common optical fiber. The common optical fiber is then demultiplexed outside of the enclosure and separated into the separate frequency signals. The separate frequency signals can then be demodulated into voltage levels and separately displayed. Such a circuit may be constructed from conventionally available parts.

In another embodiment, the output of multiplexor 111 may be transmitted from inside to outside the shielded enclosure by using the system described in copending and commonly assigned U.S. patent application Ser. No. 862, 621 filed Apr. 2, 1992, the disclosure of which is hereby incorporated by reference herein in its entirety.

While illustrative preferred embodiments of the invention have been disclosed herein, many departures from those embodiments may be made without departing from the spirit and scope of the claimed invention, and it is intended that such changes and variations be encompassed, so long as applicant's invention is employed, as defined by the following claims.

I claim:

1. A method for testing the susceptibility of a system to electromagnetic fields comprising the steps of:

a. disposing said system in a controlled electromagnetic environment, substantially free of ambient electromagnetic fields, b. attaching a probe to said system, said probe including a detector diode having an anode operatively connected to the system and a cathode providing a signal representative of the system at the point of connection, c. connecting said probe to a transmitter, d. connecting a ground of said system to said transmitter, e. producing a controlled electromagnetic field in said controlled electromagnetic environment, f. detecting, at said probe, the level of the field coupled into said system during the production of said controlled electromagnetic field, g. transmitting, to said transmitter, a first transmitted signal related to said detected field level from said probe and a ground return signal from said system, h. connecting said transmitter to a monitor and transmitting a second transmitted signal from said transmitter to said monitor;

i. monitoring the amplitude of the second transmitted signal received by the monitor, said amplitude being at a first value, j. removing the system and the probe from the controlled electromagnetic environment, k. attaching the probe to the system and connecting the probe and the system ground to the monitor, l. injecting a signal into said system, said injected signal having a predetermined relationship to said controlled electromagnetic field, m. detecting, at said probe, the level of the signal injected into the system, n. transmitting, to said monitor, a third transmitted signal related to said detected level of the injected signal, o. monitoring the amplitude of the third transmitted signal received by the monitor, said amplitude being at a second value, p. adjusting, if necessary, the amplitude of the injected signal until said second value of amplitude is approximately equal to said first value of amplitude, q. wherein said steps of injecting and adjusting the amplitude of the injected signal, outside said controlled electromagnetic environment, substantially simulate the effect of said controlled electromagnetic field on said system in the controlled electromagnetic environment.

2. The method of claim 1, wherein the steps (c) and (d) of connecting said probe and ground includes the steps of connecting said probe to the transmitter and connecting the system ground to the transmitter using respective electrically overdamped wires that are substantially transparent to electromagnetic fields.

3. The method of claim 1, wherein the electrically damped wires are overdamped in a distributed fashion.

4. The method of claim 1, wherein the step of producing a controlled electromagnetic field includes the step of producing a continuous wave field and the step of detecting, at said probe, the level of the field coupled into the system includes the step of detecting the dc level signal in said system.

5. The method of claim 1, wherein the step of transmitting the second transmitted signal to the monitor includes the step of converting the first transmitted signal and ground signal to an optical signal, transmitting said optical signal through an optical cable, and re-converting the optical signal to an electrical signal before applying the re-converted signal to said monitor.

6. The method of claim 1, wherein said step of attaching a probe to said system includes the step of attaching a plurality of diodes in series.

7. The method of claim 1, wherein said step of injecting a signal includes the step of direct voltage injection of said signal into said system.

8. The method of claim 7, wherein said step of direct voltage injection includes the step of applying the output of a signal generator to said system by way of a plurality of parallel connected capacitors.

9. The method of claim 1, further comprising the steps of applying a corrective device to said system;

re-injecting a signal into said system at the amplitude determined in step (o); and determining whether the corrective device has substantially eliminated the susceptibility of the system to said controlled electromagnetic field.

10. A method for use in testing a circuit for electromagnetic susceptibility comprising the steps of:

(a) connecting a probe having a detector diode to a wire in the circuit under test and monitoring a first signal produced in the circuit while the circuit is in a radiation field, the radiation field having a plurality of frequencies, and thereafter (b) monitoring the first signal while the circuit is in the radiation field at the plurality of frequencies; and (c) injecting a second signal into the circuit while the circuit is no longer in the radiation field to simulate the effect of the radiation field on the circuit.

11. The method of claim 10 wherein the radiation field further comprises a plurality of frequencies having a continuous wave signal.

12. The method of claim 10 wherein step (a) further comprises monitoring the first signal using a probe having more than one detector diode in series.

* * * * *